(12) United States Patent
Kanamura

(10) Patent No.: US 7,319,271 B2
(45) Date of Patent: Jan. 15, 2008

(54) SEMICONDUCTOR DEVICE

(75) Inventor: Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/341,067

(22) Filed: Jan. 27, 2006

(65) Prior Publication Data

US 2006/0192286 A1 Aug. 31, 2006

(30) Foreign Application Priority Data

Feb. 3, 2005 (JP) ............................. 2005-027364

(51) Int. Cl.
*H01L 23/48* (2006.01)
(52) U.S. Cl. ..................... 257/760; 257/750
(58) Field of Classification Search ................ 257/758, 257/750, 760
See application file for complete search history.

(56) References Cited

U.S. PATENT DOCUMENTS

| | | | |
|---|---|---|---|
| 6,313,537 B1 * | 11/2001 | Lee et al. .................... | 257/758 |
| 6,498,384 B1 * | 12/2002 | Marathe ...................... | 257/520 |
| 6,734,561 B2 * | 5/2004 | Kawai ........................ | 257/758 |
| 6,858,936 B2 * | 2/2005 | Minamihaba et al. ....... | 257/758 |

FOREIGN PATENT DOCUMENTS

JP        11-045887        2/1999

OTHER PUBLICATIONS

Kondo et al., "Low Pressure CMP for reliable porous low-k/Cu integration", IITC (2003) pp. 86-88.
Nakai et al., "A 65nm CMOS Technology with a High-Performance and Low-Leakage Transistor, a 055 μ m2 6T-SRAM Cell and Robust Hybrid-ulk/Cu Interconnects for Mobile Multimedia Applications" IEE. (USA), 2003, pp. 285-288.

* cited by examiner

*Primary Examiner*—Roy Potter
(74) *Attorney, Agent, or Firm*—Robert J. Depke; Rockey, Depke & Lyons, LLC.

(57) ABSTRACT

Disclosed herein is a semiconductor device having a multi-layer wiring structure includes a plurality of wiring layers laminated on a substrate, the wiring layers each including a buried wiring and a via formed by filling with a conductive material the inside of a wiring trench formed on the face side of a layer insulation film and a contact hole provided at a bottom portion of the wiring trench. The layer insulation films constituting the plurality of wiring layers are so configured that the layer insulation films are changed in the magnitude of mechanical strength alternately on a wiring layer basis in the lamination direction of the wiring layers.

4 Claims, 15 Drawing Sheets

SEMICONDUCTOR DEVICE

CROSS REFERENCES TO RELATED APPLICATIONS

The present invention contains subject matter related to Japanese Patent Application JP 2005-027364 filed in the Japanese Patent Office on Feb. 3, 2005, the entire contents of which being incorporated herein by reference.

BACKGROUND OF THE INVENTION

The present invention relates to a semiconductor device, particularly to a semiconductor device having a multi-layer buried wiring structure.

Attendant on rises in the degree of miniaturization and the degree of integration of semiconductor devicees, the delay of electrical signals arising from the time constant of wiring becomes a serious problem. Therefore, in multi-layer wiring structures of the semiconductor devicees, copper (Cu) wirings higher in conductivity have come to be introduced in place of aluminum-based alloy wirings. Unlike the metallic materials, such as Al, used for the multi-layer wiring structures in the past, Cu is difficult to pattern by dry etching. Therefore, to the formation of a Cu wiring, the so-called Damascene process has been applied in which a wiring trench is first formed in a layer insulation film, and then the wiring trench is filled up with Cu to thereby form a wiring pattern. Particularly, the dual Damascene process in which a wiring trench formed in a layer insulation film and a contact hole formed at a bottom portion of the wiring trench are simultaneously filled up with Cu is effective for reducing the number of steps (see Japanese Patent Laid-Open No. Hei 11-45887).

In addition, in a semiconductor device advanced in the degree of integration, an increase in wiring capacity leads to a lowering in the operating speed of the semiconductor device, and, therefore, it may be indispensable to lower the dielectric constant of the layer insulation film so as to suppress the increase in the wiring capacity.

FIG. 8 shows a sectional diagram of a semiconductor device having a multi-layer buried wiring structure obtained by application of the dual Damascene process. The semiconductor device shown in the figure has a configuration in which a local wiring layer 0 is provided on a semiconductor substrate (omitted in the figure) formed with semiconductor devices such as MOS transistor, with an under layer insulation film 1 of silicon oxide therebetween, and a first wiring layer 10-1, a second wiring layer 10-2 and so on having buried wirings are laminated on the local wiring layer 0.

Of the above-mentioned layers, the local wiring layer 0 includes a local wiring 6a formed by sequentially laminating a carbon-containing silicon oxide (SiOC) film 2 and a hard mask layer 3 of silicon oxide ($SiO_2$) on the under layer insulation film 1 to form a layer insulation film, and a trench pattern "a" formed in the layer insulation film is filled up with a copper (Cu) film 5, with a barrier metal 4 therebetween.

In addition, the first wiring layer 10-1 laminated on the local wiring layer 0 is formed in a layer insulation film obtained by laminating an anti-oxidation film 11 of silicon carbide (SiC), a low-dielectric-constant film 12, and a hard mask layer 23 of silicon oxide ($SiO_2$) in this order. The layer insulation film 11 to 13 is provided with wiring trenches "a" and a contact hole b formed to extend from the lower surface of the wiring trench "a" so as to reach the local wiring 6a, and the inside of the wiring trenches "a" and the contact hole b is filled up with a conductive film 15 of copper (Cu) or the like, with a barrier metal 14 therebetween, to form buried wirings 16a and a via 16b connected thereto.

Then, the second wiring layer 10-2, the third wiring layer 10-3 and so on configured in roughly the same manner as the first wiring layer 10-1 are sequentially laminated on the first wiring layer 10-1, to constitute a multi-layer buried wiring structure. The buried wiring 16a in each of these wiring layers 10-2, 10-3, . . . is in connection with the buried wiring 16a of the underlying layer through the via 16b.

Here, examples of the material constituting the low-dielectric-constant film 12 constituting the most part of the multi-layer buried wiring structure as above include not only the fluorine-containing silicon oxide (FSG) having a dielectric constant of about 3.5 which has been used comparatively frequently and successfully in the past but also organic polymer based materials represented by polyaryl ether (PAE), and materials having a dielectric constant of around 2.7 such as SiOC based materials represented by hydrogen-silsesquioxane (HSQ) and methylsilsesquioxane (MSQ). Furthermore, in recent years, application of low-dielectric-constant materials obtained by making these materials porous to obtain a dielectric constant of around 2.2 has been tried.

However, in the case of further lowering the dielectric constant of the low-dielectric-constant film 12 in the above-mentioned multi-layer buried wiring structure, there arise other serious technical problems such as degradation of the mechanical strength of the wiring layers. In other words, the dielectric constant and the mechanical strength of a dielectric material are usually in a trade-off relationship. Therefore, a lowering in the mechanical strength of the low-dielectric-constant film 12 constituting the most part of the wiring layers leads to a degradation of the mechanical strength of the wiring layers.

As an index of mechanical strength, hardness and elastic modulus are used. For example, while the elastic modulus of a silicon oxide film having a dielectric constant of about 4.2 is not less than 70 GPa, the elastic modulus of fluorine-containing silicon oxide (FSG) having a dielectric constant of about 3.5 which has been introduced in the 130 nm generation is as low as around 60 GPa, and, further, the elastic modulus of carbon-containing silicon oxides film (SiOC) having a dielectric constant of around 3 which have started to be introduced in the 90 nm generation is as low as about 10 GPa. Furthermore, it has been found that the porous low-dielectric-constant films having a dielectric constant of 2.5 or below the introduction of which has been investigated for the 45 nm generation and later generations show an elastic modulus as low as 5 GPa or below.

The lowering of the mechanical strength of the wiring layers as above-mentioned would cause film exfoliation or deformation in the manufacturing process of the multi-layer buried wiring structure shown in FIG. 8. Specifically, in the case of forming the buried wirings 16a and the via 16b in each of the wiring layers 10-1, 10-2, . . . , the formation of the Cu film in the state of filling up the wiring trenches "a" and the contact hole b is followed by the step of removing the surplus Cu film and surplus barrier metal film on the layer insulation film 11 to 13 by Chemical Mechanical Polishing (CMP). In the CMP step, a polishing pressure is exerted on the low-dielectric-constant film 12 which is poor in mechanical strength, so that the above-mentioned film exfoliation or deformation is liable to occur. Besides, such a trouble becomes more liable to occur as the number of wiring layers in the multi-layer wiring structure increases.

For example, in the case where a porous carbon-containing silicon oxide (SiOC) film having a dielectric constant of 2.2 and an elastic modulus of 4 GPa was used as the low-dielectric-constant film 12 in the manufacture of the multi-layer buried wiring structure shown in FIG. 8, the layers up to the first wiring layer 10-1 could be formed successfully, but film exfoliation of the layer insulation film occurred in the process of forming the second wiring layer 10-2. To be more specific, in the CMP step in the process of forming the second wiring layer 10-2, film exfoliation occurred at a low frequency in the vicinity of the low-dielectric-constant film 12 composed of porous carbon-containing silicon oxide (SiOC), at specific wiring layout locations.

In addition, in the CMP step in the process of forming the third wiring layer 10-3, further conspicuous exfoliation of the layer insulation film occurred. The film exfoliation occurred in the vicinity of the low-dielectric-constant film 12 constituting the second wiring layer 10-2 and in the vicinity of the low-dielectric-constant film 12 constituting the first wiring layer 10-1, at a frequency of about 5 times the frequency of film exfoliation generated in the process of forming the second wiring layer 10-2.

Similarly, in the CMP step in the process of forming the fourth wiring layer 10-4, a serious degree of exfoliation of the layer insulation film occurred. The film exfoliation occurred in the vicinity of the low-dielectric-constant film 12 constituting the fourth wiring layer 10-4, in the vicinity of the low-dielectric-constant film 12 constituting the third wiring layer 10-3 and in the vicinity of the low-dielectric-constant film 12 constituting the second wiring layer 10-2, at a frequency of about 25 times that of film exfoliation generated in the process of forming the second wiring layer 10-2.

In addition, if the wiring layers up to the uppermost wiring layer could be successfully formed without generation of film exfoliation, there would still remain the problem that the semiconductor device is liable to be broken at the time of packaging the semiconductor chip having the multi-layer buried wiring structure.

Thus, the following has been found. On one hand, in the case of composing the low-dielectric-constant film as the main component of the layer insulation film by use of a non-porous carbon-containing silicon oxide (SiOC) film having a dielectric constant of about 2.9 and an elastic modulus of about 10 GPa, there was no problem of film exfoliation in the manufacturing process. On the other hand, in the case where the low-dielectric-constant film as the main component of the layer insulation film is further lowered in dielectric constant and a porous carbon-containing silicon oxide (SiOC) film having a dielectric constant of about 2.2 and an elastic modulus of about 4 GPa is used, an obvious trouble occurs due to the lowering of mechanical strength.

In addition, it has been recognized that the generation of this trouble depends on the constitution of the laminate structure and the wiring layout. Specifically, it has been found out that the production of the low-dielectric-constant film as the main component of the layer insulation film by laminating a porous carbon-containing silicon oxide (SiOC) film having a dielectric constant of 2.2 and an elastic modulus of about 4 GPa accelerates the generation of this trouble. This implies that not only the elastic modulus of the low-dielectric-constant film but also the proportion of the low-elastic-modulus low-dielectric-constant film in a specified multi-layer wiring region is important.

As a method for improving the above-mentioned trouble attendant on the progress of the lowering in the dielectric constant of the layer insulation film, a method of lowering the pressure in the CMP process has been proposed (see S. Kondo et Al., "Low-pressure CMP for reliable porous low-k/Cu integration," IITC, (USA), 2003, pp. 86 to 88).

In addition to the above, a method in which a low-dielectric-constant film having a comparatively higher elastic modulus is applied to the layers formed with the via (i.e., the portion between the wiring layers) and a low-dielectric-constant film having a sufficiently lower dielectric constant (and, hence, having a comparatively lower elastic modulus) is applied only to the layers formed with the buried wirings has also been proposed (see S. Nakai et Al., "A 65 nm CMOS Technology with a High-Performance and Low-Leakage Transistor, a 0.55 µm² 6T-SRAM Cell and Robust Hybrid-ULK/Cu Interconnects for Mobile Multimedia Applications," IEEE, (USA), 2003, pp. 285 to 288).

SUMMARY OF THE INVENTION

However, according to the method of lowering the pressure in the CMP step as disclosed in S. Kondo et Al., "Low-pressure CMP for reliable porous low-k/Cu integration," IITC, (USA), 2003, pp. 86 to 88, although the generation of such troubles as film exfoliation can be restrained, there arise new problems such as a lowering in throughput of polishing and degradation of the apparatus performance due to lowerings in flatness, evenness of polishing and the like. In addition, even if the film exfoliation in the CMP step can be obviated, the subsequent troubles such as thermal hysteresis and film exfoliation, deformation or the like in the assembling step cannot be prevented from occurring.

According to the configuration in which a low-dielectric-constant film having a high mechanical strength (i.e., being not so low in dielectric constant) is applied to the layer to be formed with the via as disclosed in S. Nakai et Al., "A 65 nm CMOS Technology with a High-Performance and Low-Leakage Transistor, a 0.55 µm² 6T-SRAM Cell and Robust Hybrid-ULK/Cu Interconnects for Mobile Multimedia Applications," IEEE, (USA), 2003, pp. 285 to 288, a film having a comparatively high elastic modulus, i.e., being not so low in dielectric constant is disposed in the portion between the upper and lower buried wirings (i.e., in the layer to be formed with the via). Therefore, it is difficult to achieve a lowering in the dielectric constant of the portion between the upper and lower buried wirings. Particularly, in a special layer required to be lowered in wiring capacity (critical layer), a further lowering in dielectric constant may be demanded between the upper and lower buried wirings, and, therefore, this technique may not necessarily be satisfactory from the viewpoint of enhancing the wiring performance. Accordingly, it seemed impossible to contrive a higher wiring performance by this technique.

Thus, there is a need to provide a semiconductor device having a multi-layer buried wiring structure by which it is possible to obviate such troubles as a lowered throughput, film exfoliation and deformation during the manufacturing steps and to contrive enhancement of wiring performance.

In order to meet the above need, according to the present invention, there is provided a semiconductor device having a multi-layer wiring structure including a plurality of wiring layers laminated on a substrate, the wiring layers each including a buried wiring and a via formed by filling with a conductive material the inside of a wiring trench formed on the face side of a layer insulation film and a contact hole provided at a bottom portion of the wiring trench. Particularly, the layer insulation films each formed with the buried wiring and the via at the lower portion thereof are so configured that the layer insulation films are changed in the magnitude of mechanical strength alternately on a wiring layer basis in the lamination direction of the wiring layers.

In the semiconductor device as above, the lamination of the wiring layers formed by use of the layer insulation films is so configured that the layer insulation films are changed in mechanical strength alternately on a wiring layer basis in the lamination direction of the wiring layers. Therefore, the wiring layer having the layer insulation film being high in mechanical strength and the wiring layer having the layer insulation film being comparatively lower in mechanical strength are laminated alternately. Accordingly, the layer insulation films poor in mechanical strength are dividedly distributed in the lamination direction, and the condition where a layer insulation film portion being low in mechanical strength occupies a monolithic large volume is obviated, so that the mechanical strength of the laminate structure itself is secured. Particularly, in the semiconductor device with this configuration, the buried wiring and the via at a bottom portion thereof are collectively included in the wiring layer. Therefore, in the wiring layer in which the layer insulation film is composed of the material lowered in mechanical strength due to the sufficient lowering in dielectric constant, a sufficient lowering in dielectric constant can be contrived not only between the buried wirings in the same layer which are formed on the face side of the layer insulation film but also between the buried wiring in a layer and the buried wiring in the underlying layer.

As has been described above, according to the present invention, it is possible to provide a wiring layer capable of achieving a lowering in dielectric constant between buried wirings in the same layer and between buried wiring layers, while securing the mechanical strength of a laminate wiring structure. Therefore, by disposing a circuit wiring required of enhanced functions in this wiring layer, it is possible to contrive enhancement of wiring performance. Accordingly, it is possible to enhance the functions of a semiconductor device through enhancement of wiring performance, without generating such troubles as a lowered throughput, film exfoliation and deformation during the manufacturing steps.

DETAILED DESCRIPTION OF THE PREFERRED EMBODIMENTS

Now, some embodiments of the semiconductor device according to the present invention will be described in detail below, based on the drawings. In each of the embodiments, the configuration of the semiconductor device and the manufacturing method thereof will be described in this order.

First Embodiment

Figure 1:
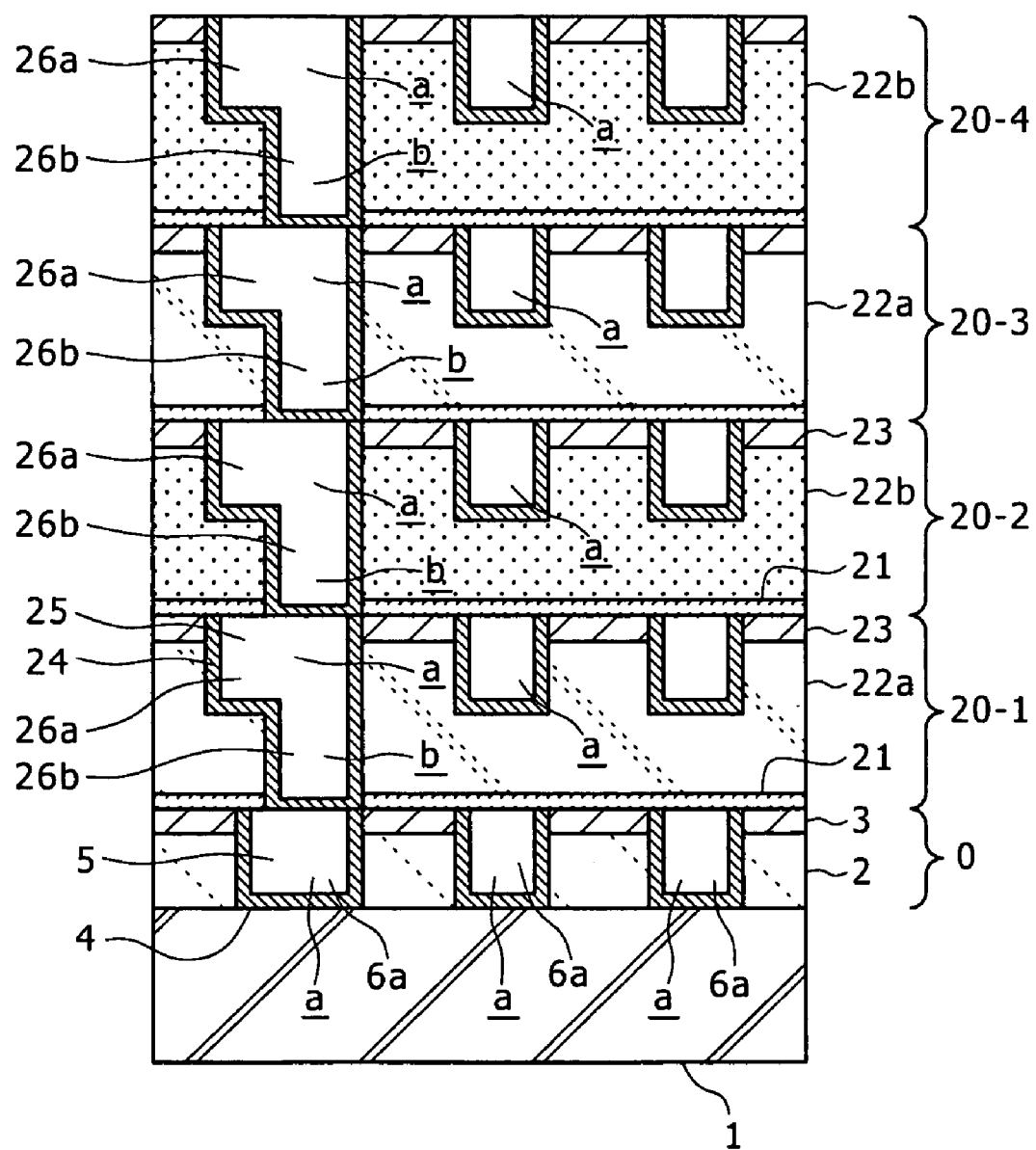
FIG. 1 is a sectional configuration diagram showing a multi-layer wiring structure in a semiconductor device according to a first embodiment of the present invention.

FIG. 1 is a sectional configuration diagram of the semiconductor device according to a first embodiment. The semiconductor device shown in the figure has a multi-layer buried wiring structure formed by application of the dual Damascene process. Specifically, a local wiring layer 0 is provided on a semiconductor substrate (omitted in the figure) provided with semiconductor devices such as MOS transistor, with an under layer insulation film 1 of silicon oxide therebetween, and a first wiring layer 20-1, a second wiring layer 20-2 and so on each including buried wirings are laminated on the local wiring layer 0. The first embodiment is configurationally characterized in that the first wiring layer 20-1, the second wiring layer 20-2 and so on are configured to be alternately different in the order of lamination, the detailed configurations being described below.

First, the local wiring layer 0 serving as an under layer for the laminate structure of the first wiring layer 20-1, the second wiring layer 20-2 and so on is produced by a method in which a layer insulation film composed of a carbon-containing silicon oxide (SiOC) film 2 and a hard mask layer 3 formed of silicon oxide ($SiO_2$) is provided on the under layer insulation film 1, and trech patterns "a" formed in the layer insulation film are filled up with a copper (Cu) film 5, with a barrier metal 4 therebetween, to form local wirings 6a.

Then, the first wiring layer 20-1 laminated on the local wiring layer 0 is composed by use of a layer insulation film obtained by laminating an anti-oxidation film 21 formed of silicon carbide (SiC), a low-dielectric-constant film 22a, and a hard mask layer 23 formed of silicon oxide ($SiO_2$) in this order. The layer insulation film composed of these insulation films 21, 22a and 23 is provided with wiring trenches "a" on the face side thereof and with a contact hole b extended from the bottom surface of the wiring trench "a" so as to reach the local wiring 6a. The inside of the wiring trenches "a" and the contact hole b is integrally filled up with a conductive material film such as a copper (Cu) film 25, with a barrier metal 24 therebetween, to form buried wirings 26a and a via 26b connected thereto. Thus, the first wiring layer 20-1 is configured to include the layer insulation film composed of the anti-oxidation film 21, the low-dielectric-constant film 22a, and the hard mask layer 23; the buried wirings 26a; and the via 26b thereunder.

In addition, the low-dielectric-constant film 22a constituting the most part of the layer insulation film in the first wiring layer 20-1 is preferably formed by use of a material having a dielectric constant as low as possible, for example, a dielectric constant of 2.5 or below, taking into primary account the lowering of the dielectric constant between the upper and lower buried wirings 26a and the dielectric constant between the portions of the buried wiring 26a in the first wiring layer 20-1.

Specific examples of the low-dielectric-constant film 22a having a dielectric constant of 2.5 or below include carbon-containing silicon oxide (SiOC) films formed by a CVD (Chemical Vapor Deposition) process using trimethylsilane (3MS), tetramethylcyclotetrasiloxane (TMCTS) or the like as a silicon source; porous SiOC films made to be porous by introducing a poregen into the SiOC films; coating materials containing silicon as a main component, such as a methylsilsesquioxane (MSQ) film, a hydrogensilsesquioxane (HSQ) film, a polymer (HMSQ) film thereof; and a porous MSQ film, a porous HSQ film, and a porous HMSQ film obtained therefrom by introduction of a poregen and a heat treatment. Among others, by use of the porous low-dielectric-constant film 22a, a lowering in dielectric constant can be securely achieved. It should be noted here, however, that as for mechanical strength, such a low-dielectric-constant film 22a has an elastic modulus of 5 GPa or below. Incidentally, the low-dielectric-constant film 22a is lower in dielectric constant but poorer in mechanical strength than a reinforcing film constituting the second wiring layer 20-2 (which will be described next), and the mechanical strength thereof is less than 10 GPa.

Here, as an example, a porous carbon-containing silicon oxide (SiOC) film having a dielectric constant of 2.2 is used as the low-dielectric-constant film 22a. Incidentally, the low-dielectric-constant film 22a has an elastic modulus of about 4 GPa.

The second wiring layer 20-2 laminated on the first wiring layer 20-1 is characterized by a configuration in which an insulation film formed of a material having a higher mechanical strength is used as a reinforcing film 22b, in place of the low-dielectric-constant film 22a used in the first wiring layer 20-1; in the other points, the second wiring layer 20-2 may be configured in substantially the same manner as the first wiring layer 20-1.

Namely, the second wiring layer 20-2 is composed by use of a layer insulation film obtained by laminating an anti-oxidation film 21 formed of silicon carbide (SiC), the reinforcing film 22b having a comparatively high mechanical strength, and a hard mask layer 23 formed of silicon oxide ($SiO_2$) in this order. The layer insulation film composed of these insulation films 21, 22b and 23 is provided with wiring trenches "a" on the face side thereof and with a contact hole b extending from the bottom surface of the wiring trench "a" so as to reach the wiring in the underlying layer. The inside of the wiring trenches "a" and the contact hole b is integrally filled up with a conductive film such as a copper (Cu) film, with a barrier metal 24 therebetween, to form buried wirings 26a and a via 26b connected thereto. Thus, the second wiring layer 20-2 is configured to include the layer insulation film composed of the anti-oxidation film 21, the reinforcing film 22b, and the hard mask layer 23; the buried wirings 26a; and the via 26b thereunder.

The reinforcing film 22b constituting the most part of the layer insulation film in the second wiring layer 20-2, as has been above-mentioned, is composed by use of a low-dielectric-constant material higher in mechanical strength than the low-dielectric-constant film 22a constituting the most part of the underlying first wiring layer 20-1, and has an elastic modulus of not less than 10 GPa. It should be noted here, however, the reinforcing film 22b having such an elastic modulus has a dielectric constant of not less than 2.9, and, of the materials having these characteristics, one that has a comparatively low dielectric constant is preferably used. Therefore, the reinforcing film 22b also is a kind of low-dielectric-constant film.

Here, specific examples of the reinforcing film 22b having an elastic modulus of not less than 10 GPa include non-porous carbon-containing silicon oxide (SiOC) film formed by a CVD process using trimethylsilane (3MS), tetramethylcyclotetrasiloxane (TMCTS) or the like as a silicon source; fluorine-containing silicon oxide (FSG) film and silicon oxide ($SiO_2$) film similarly formed by a CVD process using a silicon source; and coating materials containing silicon as a main component, such as non-porous methylsilsesquioxane (MSQ) and hydrogensilsesquioxane (HSQ). Particularly, by use of a non-porous reinforcing film 22b, the desired level of mechanical strength can be securely obtained.

Here, as an example, a non-porous carbon-containing silicon oxide (SiOC) film having an elastic modulus of 10 GPa and a dielectric constant of 2.9 is used as the reinforcing film 22b.

The third wiring layer 20-3 laminated on the second wiring layer 20-2 is the same as the first wiring layer 20-1 in layer configuration, in which a layer insulation film composed mostly of a low-dielectric-constant film 22a formed by use of a material having a dielectric constant as low as possible (a dielectric constant of 2.5 or below) is provided with buried wirings 26a and a via 26b.

The fourth wiring layer 20-4 laminated on the third wiring layer 20-3 is the same as the second wiring layer 20-2 in layer configuration, in which a layer insulation film composed mostly of a reinforcing film 22b having a higher mechanical strength (an elastic modulus of not less than 10 GPa) than that in the underlying third wiring layer 20-3 is provided with buried wirings 26a and a via 26b.

In the case where a fifth wiring layer, a sixth wiring layer and so on (omitted in the figure) are laminated on the fourth wiring layer 20-4, a wiring layer with a layer configuration including a low-dielectric-constant film 22a having a dielectric constant as low as possible in the same manner as the first wiring layer 20-1 and a wiring layer with a layer configuration including a reinforcing film 22b having a higher mechanical strength (preferably, an elastic modulus of not less than 10 GPa) than the underlying layer in the same manner as the second wiring layer 20-2 are alternately laminated.

In the foregoing, the carbon-containing silicon oxide (SiOC) film 2 having an elastic modulus of 10 GPa and a dielectric constant of 2.9 is used as the layer insulation film in the local wiring layer 0. However, the layer insulation film in the local wiring layer 0 is not limited to this one. In the local wiring layer 0, there are no definite limitations as to the physical property values of the layer insulation film, since the demand here for the lowering of the dielectric constant on a wiring performance basis is weaker as compared with the cases of the wiring layers 20-1, 20-2, . . . provided thereon, and an insulation film having a high mechanical strength such as a silicon oxide ($SiO_2$) film is generally used as the under layer insulation film 1.

Now, a method of manufacturing the semiconductor device according to the first embodiment as above will be described below, based on sectional step diagrams shown in FIGS. 2A to 2K.

First, semiconductor devices such as MOS transistor are formed on the face side of a semiconductor substrate (omitted in the figures here), and an under layer insulation film composed of silicon oxide is formed on the substrate.

Figure 2A:
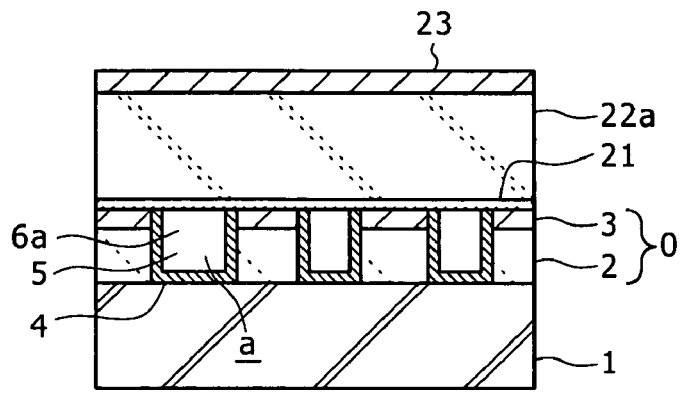
FIGS. 2A to 2K are sectional step diagrams for illustrating the manufacture of the semiconductor device according to the first embodiment.

Then, as shown in FIG. 2A, a layer insulation film obtained by laminating a carbon-containing silicon oxide (SiOC) film 2 and a hard mask layer 3 composed of silicon oxide ($SiO_2$) is formed on the under layer insulation film 1 covering the face side of the semiconductor substrate. Subsequently, the layer insulation film is provided with trech patterns "a", a copper (Cu) film 5 is formed in the state of filling up the inside of the trech patterns "a", with a barrier metal 4 therebetween, and thereafter surplus portions of the copper (Cu) film 5 and the barrier metal 4 are removed by CMP using the layer insulation film as a stopper, thereby forming a local wiring 6a in which the Cu film is buried in the inside of the trech patterns "a" (i.e., the inside of the trech patterns "a" is filled up with the Cu film).

Next, an anti-oxidation film 21 formed of silicon carbide (SiC), a low-dielectric-constant film 22a composed of a porous carbon-containing silicon oxide (SiOC) film, and a hard mask layer 23 formed of silicon oxide ($SiO_2$) are laminated in this order on the local wiring layer 0 provided with the buried type (fill-up type) local wiring 6a as above, to obtain a layer insulation film.

In this case, the low-dielectric-constant film 22a composed of the porous carbon-containing silicon oxide (SiOC) film is formed by a method in which a solution prepared by adding an organic solvent and a poregen to MSQ (which is an organic silicone resin) is applied by a spin coating process, followed by a curing treatment at 300 to 400° C. in a nitrogen atmosphere. The porous carbon-containing silicon oxide (SiOC) film thus formed has an elastic modulus of 4 GPa and a dielectric constant of about 2.2. Besides, in the case of using other material films having a dielectric constant of not more than 2.5 (elastic modulus: not more than 5 GPa), film forming methods suitable for the respective materials are used. Incidentally, the hard mask layer 23 may not necessarily be formed, provided that such problems as deshaping, exfoliation of the conductive film, troubles as to CMP polishing characteristics, etc. would not be generated in the subsequent dual Damascene process. Here, however, description will be continued on the assumption that the hard mask layer 23 is provided.

Figure 2B:
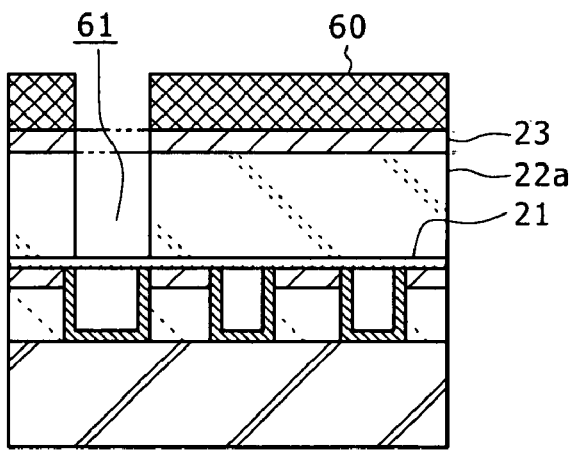

Next, as shown in FIG. 2B, a resist pattern 60 to be a mask with a contact hole pattern opened therein is formed on the hard mask layer 23 laminated as above.

Subsequently, with the resist pattern 60 as a mask, the hard mask layer 23 and the low-dielectric-constant film 22a are dry etched, to form an intermediate opening 61 for a contact hole. Incidentally, the intermediate opening 61 for the contact hole is extended here to a position immediately above the silicon carbide (SiC) film 21, thereby exposing the silicon carbide (SiC) film 21, but the etching amount can be set according to the subsequent wiring trench forming step, so that the etching amount adopted in this embodiment is not limitative. In addition, after the dry etching is finished, the remaining resist pattern 60 for the contact hole is removed by an ashing treatment or the like.

Figure 2C:
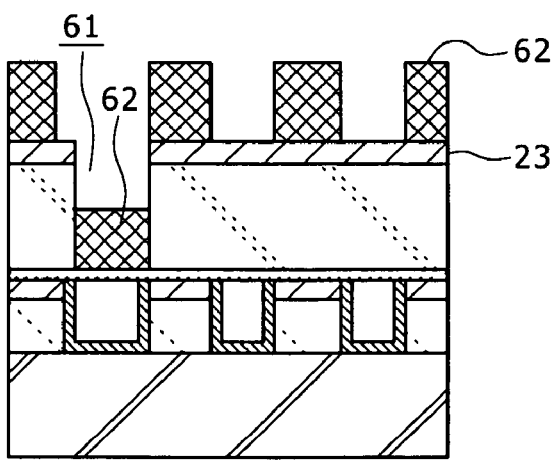

Next, as shown in FIG. 2C, a resist pattern 62 for opening wiring trench patterns is formed on the hard mask layer 23 provided with the intermediate opening 61 for the contact hole. In this case, a lower portion of the inside of the intermediate opening 61 is also filled with the resist pattern 62, so as to protect a bottom portion of the intermediate opening 61.

Figure 2D:
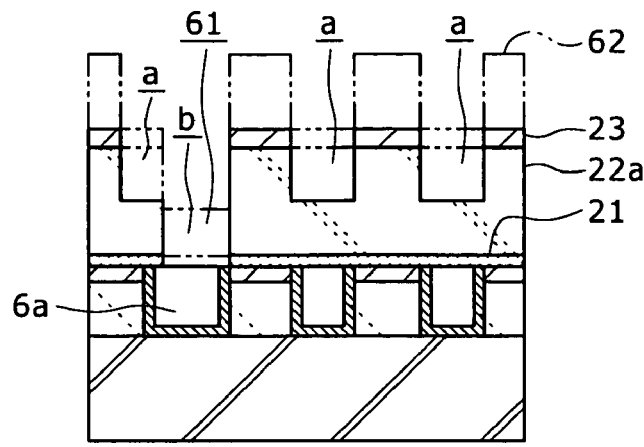

Subsequently, as shown in FIG. 2D, with the resist pattern 62 as a mask, the hard mask layer 23 and the low-dielectric-constant film 22a are dry etched, to open wiring trenches "a". With a bottom portion of the wiring trench "a" is communicated the intermediate opening 61 for the contact hole, which has been formed. In this etching step, a laminate hard mask may be used as the etching mask in the case where there are restrictions as to the remaining portion of the resist pattern 62, the resist burying characteristics for the contact hole, or the like.

Thereafter, the remaining resist pattern 62 as well as the low-dielectric-constant film 22a and the SiC anti-oxidation film 21 remaining at a bottom portion of the intermediate opening 61 for the contact hole are removed. As a result, a dual Damascene shape is formed in which the contact hole b formed to expose the underlying local wiring 6a is opened in a bottom portion of the wiring trench a. After the above steps, etching deposits left on side walls of the wiring trench "a" and the contact hole b as well as a denatured Cu layer present at a bottom portion of the contact hole b are cleaned up by a post-treatment using an appropriate chemical and a hydrogen annealing treatment.

Incidentally, the method of forming the dual Damascene shape including the wiring trenches "a" and the contact hole b provided at the bottom portion thereof is not limited to the above-described procedure. For example, another method may be adopted in which the shape of the wiring trenches is transferred to the hard mask layer, thereafter intermediate opening of the contact hole is conducted, and then the formation of the wiring trenches "a"nd complete opening of the contact hole are conducted by use of a hard mask layer; naturally, still other procedures may also be adopted.

Figure 2E:
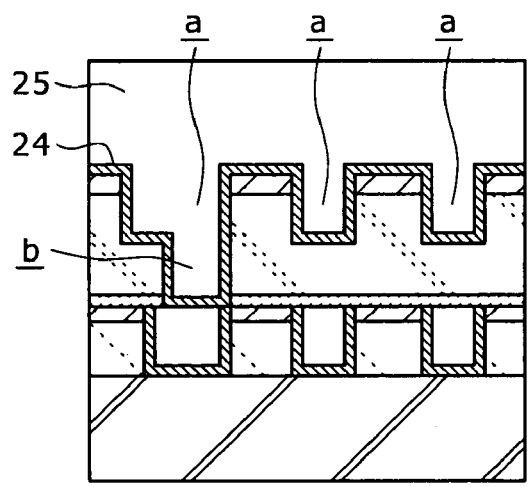

Next, as shown in FIG. 2E, a tantalum (Ta) film, for example, is formed as a barrier metal 24 by sputtering, and then a copper (Cu) film 25 is formed in the state of filling up the wiring trenches "a" and the contact hole b by electroplating or sputtering.

Figure 2F:
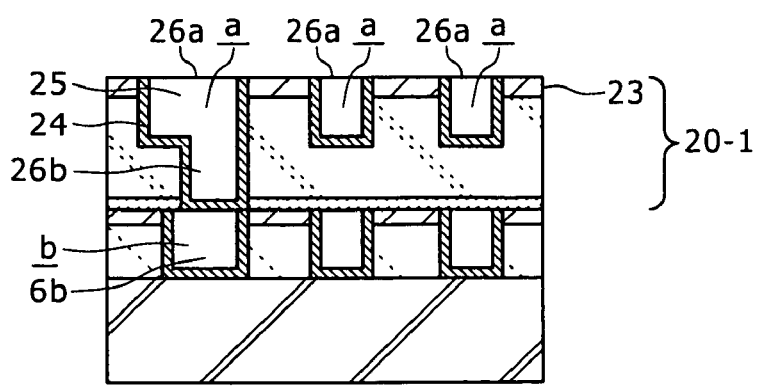

Thereafter, as shown in FIG. 2F, surplus Cu 25 and surplus barrier metal 24 on the hard mask layer 23 are removed, in the manner of obtaining a flat surface, by CMP. As a result, the first wiring layer 20-1 is obtained, in which the wiring trenches "a" and the contact hole b extended from a bottom portion of the wiring trench "a" so as to reach the local wiring 6a are integrally filled up with the copper (Cu) film 25, with the barrier metal 24 therebetween, to form the buried wirings 26a and the via 26b.

Figure 2G:
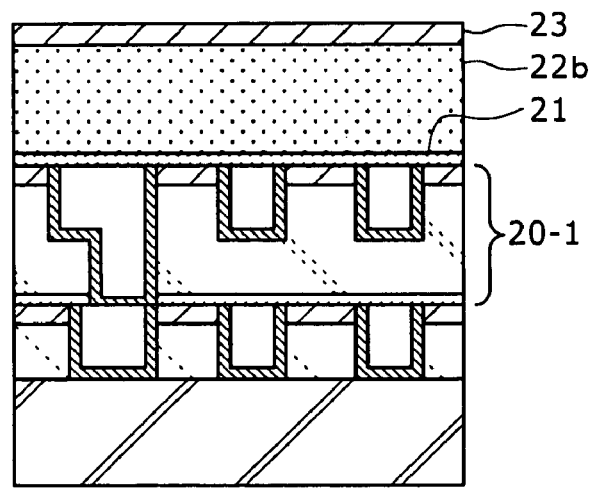

Next, as shown in FIG. 2G, an anti-oxidation film 21 formed of silicon carbide (SiC), a reinforcing film 22b composed of a non-porous carbon-containing silicon oxide (SiOC) film, and a hard mask layer 23 formed of silicon oxide ($SiO_2$) are laminated in this order on the first wiring layer 20-1, to form a layer insulation film.

In this case, the reinforcing film 22b composed of the non-porous carbon-containing silicon oxide (SiOC) film is formed by using a parallel flat plates type plasma CVD apparatus with trimethylsilane (3MS) as a silicon source. The film forming conditions are a substrate temperature of 300 to 400° C., a plasma power of 150 to 350 W, and a film forming atmosphere pressure of about 100 to 1000 Pa. The non-porous carbon-containing silicon oxide (SiOC) film thus formed has an elastic modulus of 10 GPa and a dielectric constant of about 2.9. In the cases of using other material films having an elastic modulus of not less than 10 GPa as the reinforcing film 22b, film forming methods suitable for the respective materials are used. Incidentally, the hard mask layer 23 may be omitted, provided that such problems as deshaping, exfoliation of conductive film, troubles as to CMP polishing characteristics, etc. would not be generated in the subsequent dual Damascene process.

Figure 2H:
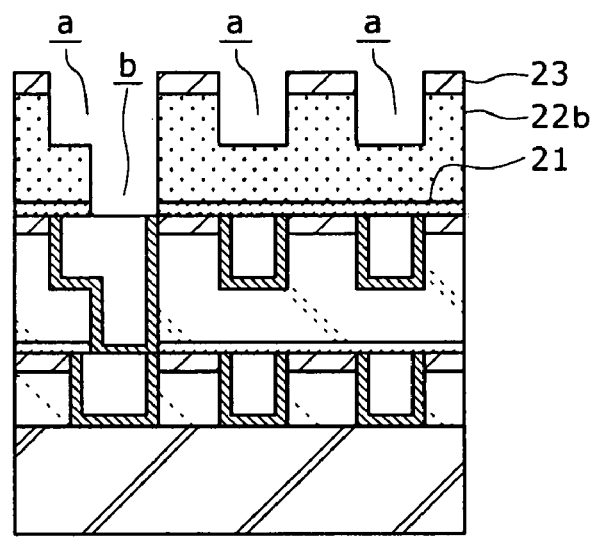

Subsequently, as shown in FIG. 2H, the laminate film of the hard mask layer 23, the reinforcing film 22b, and the anti-oxidation film 21 is provided with a dual Damascene shape including wiring trenches "a" and a contact hole b provided at a bottom portion thereof. The wiring trenches "a" and the contact hole b are formed in the same manner as the wiring trench "a" and the contact hole b in the first wiring layer 20-1 described above referring to FIGS. 2B to 2D.

Figure 2I:
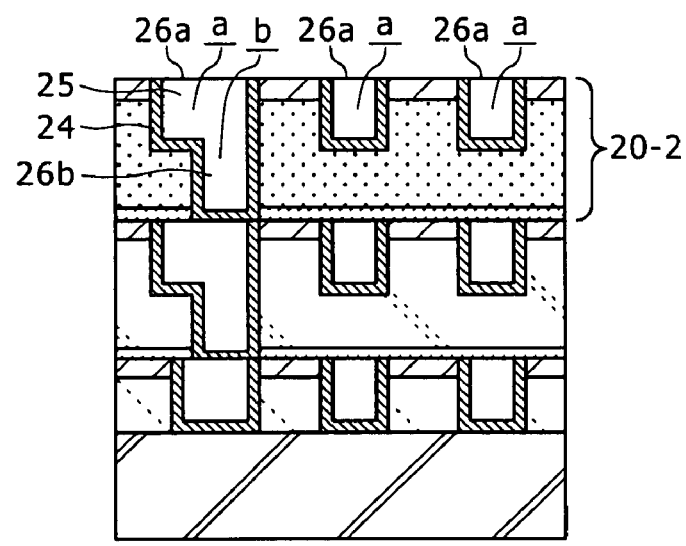

Next, as shown in FIG. 2I, the inside of the wiring trenches "a" and the contact hole b is integrally filled up with a copper (Cu) film 25, with a barrier metal 24 therebetween, to form buried wirings 26a and a via 26b. The buried wirings 26a and the via 26b are formed by the procedure based on the application of a CMP process, in the same manner as in forming the buried wirings 26a and the via 26b in the first wiring layer 20-1 described above referring to FIGS. 2E and 2F.

In this manner, the second wiring layer 20-2 is formed, in which the inside of the wiring trenches "a" and the contact hole b provided at a bottom portion thereof are integrally filled up with the copper (Cu) film 25, with the barrier metal 24 therebetween, to form the buried wirings 26a and the via 26b connected thereto.

Figure 2J:
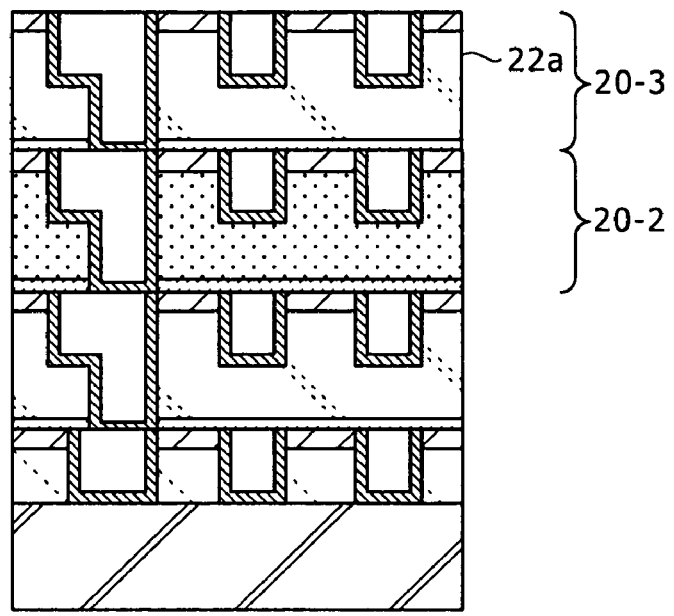

After the above steps, the steps of forming the first wiring layer 20-1 described referring to FIGS. 2A to 2F are repeated, whereby as shown in FIG. 2J, a third wiring layer 20-3 including a low-dielectric-constant 22a composed of a porous carbon-containing silicon oxide (SiOC) film (with an elastic modulus of 4 GPa and a dielectric constant of about 2.2) is formed on the second wiring layer 20-2.

Figure 2K:
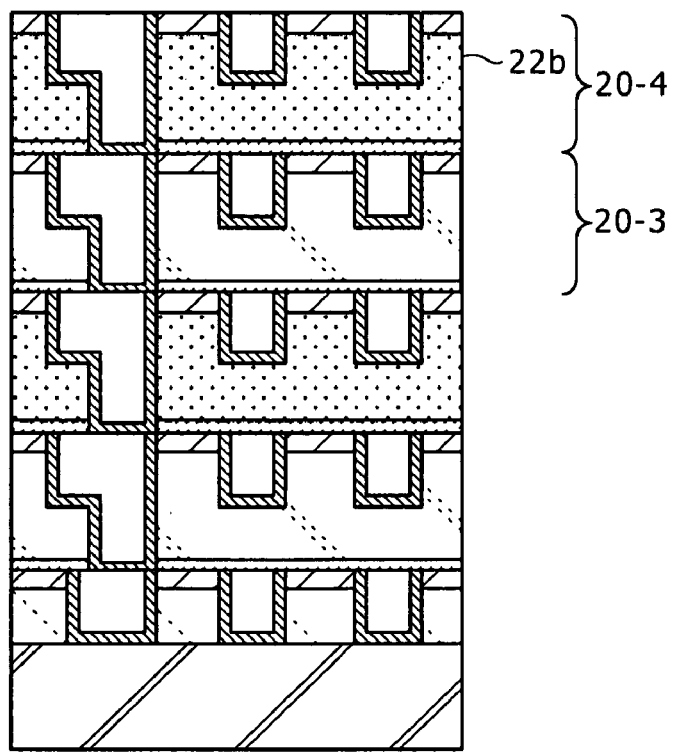

Furthermore, the steps described referring to FIGS. 2G to 2I are repeated, whereby as shown in FIG. 2K, a fourth wiring layer 20-4 including a reinforcing film 22b composed of a non-porous carbon-containing silicon oxide (SiOC) film (with an elastic modulus of 10 GPa and a dielectric constant of about 2.9) is formed on the third wiring layer 20-3.

In addition, if required, further the steps described referring to FIGS. 2A to 2F and thereafter the steps described referring to FIGS. 2G to 2I are repeated, to complete a semiconductor device having a laminated buried wiring structure in which the wiring layers 20-1 and 20-3 having the film configuration including the low-dielectric-constant film 22a with a dielectric constant as low as possible and the wiring layers 20-2 and 20-4 having the film configuration including the reinforcing film 22b with a comparatively higher mechanical strength (preferably, an elastic modulus of not less than 10 GPa) are alternately laminated.

In the first embodiment as described above, in the multi-layer wiring structure composed of a lamination of the wiring layers 20-1, 20-2, . . . , the low-dielectric-constant film 22a with a sufficiently low dielectric constant of 2.5 or below is used as the layer insulation films constituting the first wiring layer 20-1 and the third wiring layer 20-3. Such a low-dielectric-constant film 22a has a low mechanical strength, i.e., a low elastic modulus of 5 GPa or below. On the other hand, the layer insulation films constituting the second wiring layer 20-2 and the fourth wiring layer 20-4 alternately laminated with these wiring layers (20-1, 20-3) are composed by use of the reinforcing film 22b having a high mechanical strength (an elastic modulus of not less than 10 GPa). Therefore, lamination of two or more low-mechanical-strength wiring layers directly on each other is obviated in the multi-layer wiring structure, so that the layer insulation films low in mechanical strength are dividedly distributed in the lamination direction, and the condition where a layer insulation film portion low in mechanical strength occupies a monolithic large volume is prevented from occurring.

This ensures that a semiconductor device with good conduction characteristics and wiring performance can be manufactured in a good yield, without generating film exfoliation in the CMP steps in forming the wiring layers 20-1, 20-2, . . . (particularly, upper layers) and without such troubles as film exfoliation and deformation in other steps for forming the multi-layer wiring structure.

In addition, particularly, each of the wiring layers 20-1, 20-2, . . . is a singly collected wiring layer including the buried wirings 26a and the via 26b thereunder. Therefore, in the first wiring layer 20-1 and the third wiring layer 20-3 in each of which the layer insulation film is composed by use of the low-dielectric-constant film 22a sufficiently lowered in dielectric constant and hence being low in mechanical strength, a sufficient lowering in dielectric constant can be contrived not only between the buried wirings 26a in the same layer formed on the face side of the layer insulation film but also between the buried wirings 26a in this layer and the buried wirings 26a in the underlying layer. Therefore, when circuit wirings required of enhanced functions are disposed in the first wiring layer 20-1 and the third wiring layer 20-3, it is possible to contrive enhancement of wiring performance. Here, with the configuration in the first embodiment described above, a reduction in RC delay of not less than about 20% can be achieved, as compared with the case where all wiring layers are formed by use of an inorganic insulation film having a dielectric constant of 2.9 or above.

Second Embodiment

Figure 3:
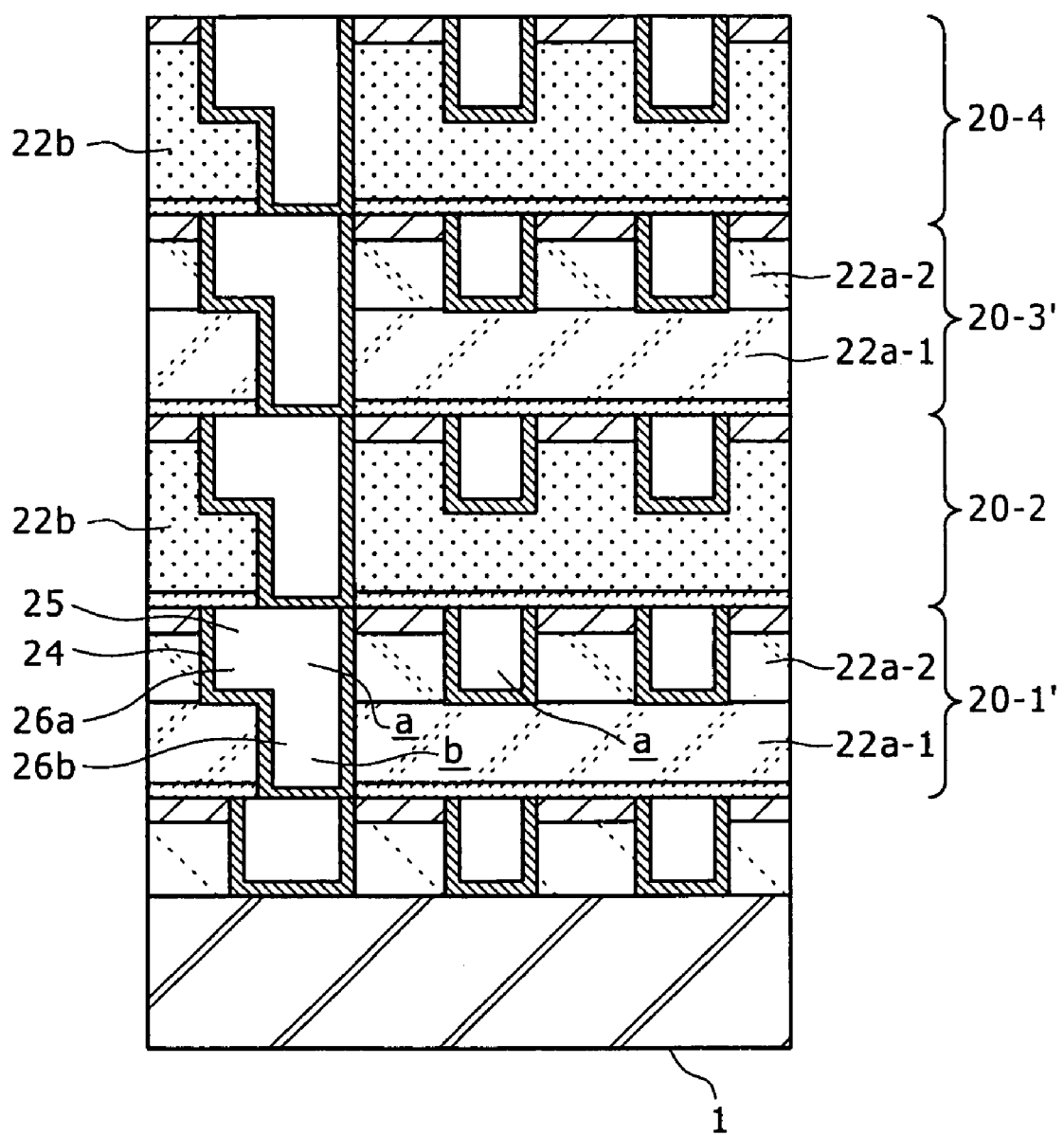
FIG. 3 is a sectional configuration diagram showing a multi-layer wiring structure in a semiconductor device according to a second embodiment of the present invention.

FIG. 3 is a sectional configuration diagram of a semiconductor device according to a second embodiment. The semiconductor device in the second embodiment shown in the figure is configured in the same manner as the semiconductor device in the first embodiment described referring to FIG. 1, except that a low-dielectric-constant film used for forming a first wiring layer 20-1' and a third wiring layer 20-3' has a hybrid structure of an inorganic low-dielectric-constant film 22a-1 and an organic low-dielectric-constant film 22a-2.

Specifically, the first wiring layer 20-1' and the third wiring layer 20-3' are each composed by use of a layer insulation film obtained by laminating an anti-oxidation film 21 formed of silicon carbide (SiC), the inorganic low-dielectric-constant film 22a-1, the organic low-dielectric-constant film 22a-2, and a hard mask layer 23 formed of silicon oxide ($SiO_2$) in this order. The layer insulation film composed of these insulation films 21, 22a-1, 22a-2 and 23 is provided with wiring trenches "a" on the face side and a contact hole b extended from a lower surface of the wiring trench "a" so as to reach the wiring in the underlying layer. The inside of the wiring trenches "a" and the contact hole b is integrally filled up with a conductive material film such as a copper (Cu) film 25, with a barrier metal 24 therebetween, to form buried wirings 26a and a via 26b connected thereto. In this manner, the first wiring layer 20-1' and the third wiring layer 20-3' are configured, each including the layer insulation film composed of the anti-oxidation film 21, the low-dielectric-constant film 22a, and the hard mask layer 23; the buried wirings 26a; and the via 26b thereunder.

The inorganic low-dielectric-constant film 22a-1 and the organic low-dielectric-constant film 22a-2 constituting the most part of the layer insulation films in the first wiring layer 20-1' and the third wiring layer 20-3' are preferably composed by use of materials as low as possible in dielectric constant, for example, materials having dielectric constants of not more than 2.5. It should be noted here, however, such low-dielectric-constant films 22a each have a mechanical strength in terms of elastic modulus of 5 GPa or below. Incidentally, these low-dielectric-constant films 22a-1 and 22a-2 are configured as films lower in dielectric constant but weaker in mechanical strength than reinforcing films constituting a second wiring layer 20-2 and a fourth wiring layer 20-4, and their mechanical strengths are less than 10 GPa.

Here, specific examples of the inorganic low-dielectric-constant film 22a-1 with a dielectric constant of not more than 2.5 (elastic modulus: not more than 5 GPa) include carbon-containing silicon oxide (SiOC) film formed by a CVD process using trimethylsilane (3MS), tetramethylcyclotetrasiloxane (TMCTS) or the like as a silicon source; porous SiOC film made to be porous by introducing a poregen into the SiOC film; coating materials containing silicon as a main component, such as methylsilsesquioxane (MSQ) and hydrogensilsesquioxane (HSQ); and porous MSQ, porous HSQ, and porous HMSQ, obtained from the coating materials by introduction of a poregen and a heat treatment.

Here, as an example, a porous carbon-containing silicon oxide (SiOC) film having a dielectric constant of 2.2 (elastic modulus: 4 GPa) is used as the inorganic low-dielectric-constant film 22a-1.

In addition, specific examples of the organic low-dielectric-constant film 22a-2 having a dielectric constant of not more than 2.5 (elastic modulus: not more than 5 GPa) include polyaryl ether (PAE) film, polyarylene ether film, amorphous carbon film, polytetrafluoroethylene film, fluorine-containing carbon film, and porous organic films obtained by making these films porous.

Here, as an example, a porous polyaryl ether film having a dielectric constant of 2.2 (elastic modulus: 4 GPa) is used as the organic low-dielectric-constant film 22a-2.

The first wiring layer 20-1' and the third wiring layer 20-3' each having the laminate structure of the inorganic low-dielectric-constant film 22a-1 and the organic low-dielectric-constant film 22a-2 having the very low dielectric constants of not more than 2.5 are alternately laminated with the second wiring layer 20-2 and the fourth wiring layer 20-4 each including the reinforcing film 22b having a comparatively higher mechanical strength (preferably, an elastic modulus of not less than 10 GPa), in the same manner as in the first embodiment.

Now, a method of manufacturing the semiconductor device according to the second embodiment as above-described will be described below, based on sectional step diagrams shown in FIGS. 4A to 4H.

Figure 4A:
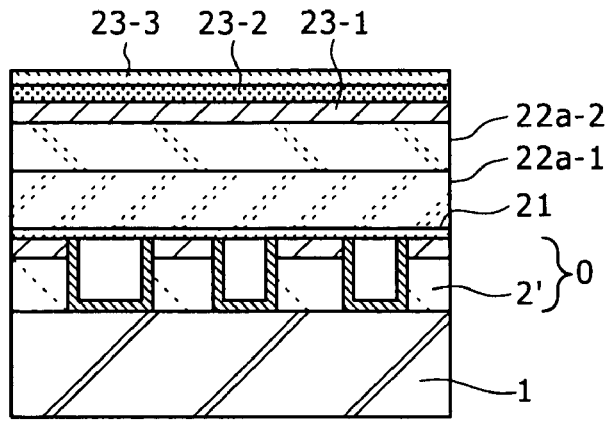
FIGS. 4A to 4H are sectional step diagrams for illustrating the manufacture of the semiconductor device according to the second embodiment.

First, as shown in FIG. 4A, the steps of forming an under layer insulation film 1 formed of silicon oxide on a semiconductor substrate provided with semiconductor devices such as MOS transistor and then forming a local wiring layer 0 thereon are conducted in the same manner as in the first embodiment. Incidentally, as a layer insulation film on the under layer insulation film 1 for constituting the local wiring layer 0, an organic film 2' such as a PAE film is used here. It should be noted here, however, the layer insulation film of the local wiring layer is not limited to this one. In the local wiring layer 0, there are no definite restrictions as to the physical property values of the layer insulation film, since the demand for lowering the dielectric constant on a wiring performance basis is weaker, as compared with that in wiring layers 20-1, 20-2, . . . to be formed thereon, and an insulation film with a higher mechanical strength such as a silicon oxide ($SiO_2$) film is generally adopted as the under layer insulation film 1.

Next, an anti-oxidation film 21 formed of silicon carbide (SiC), an inorganic low-dielectric-constant film 22a-1 composed of a porous carbon-containing silicon oxide (SiOC) film, an organic low-dielectric-constant film 22a-2 formed of porous PAE, a first hard mask layer 23-1 formed of silicon oxide ($SiO_2$), a second hard mask layer 23-2 formed of silicon nitride (SiN), and a third hard mask layer 23-3 formed of silicon oxide ($SiO_2$) are laminated in this order on the local wiring layer 0, to form a layer insulation film. Incidentally, the film structure of the hard mask is not limited to such a three-layer laminate structure, and may be configured in any way inasmuch as such troubles as deshaping, exfoliation of conductive film, and troubles relating to CMP polishing characteristics would not be generated in the subsequent dual Damascene process.

In this case, the inorganic low-dielectric-constant film 22a-1 composed of the porous carbon-containing silicon oxide (SiOC) film is formed in the same manner as the low-dielectric-constant film (22a) composed of the porous carbon-containing silicon oxide (SiOC) film described referring to FIG. 2A in the first embodiment above. The porous carbon-containing silicon oxide (SiOC) film thus formed has an elastic modulus of 4 GPa and a dielectric constant of about 2.2. Incidentally, in the cases of using other material films as the inorganic low-dielectric-constant film 22a-1 having a dielectric constant of not more than 2.5 (elastic modulus: not more than 5 GPa), film forming methods suitable for the respective materials are used.

In addition, the organic low-dielectric-constant film 22a-2 formed of porous PAE is formed by forming a film of a solution prepared by adding an organic solvent and a poregen to a polyaryl ether precursor by a spin coating technique, followed by a curing treatment at 300 to 400° C. in a nitrogen atmosphere. The porous PAE film thus formed has an elastic modulus of 3 GPa and a dielectric constant of 2.2. Incidentally, in the cases of using other material films as the organic low-dielectric-constant film 22a-2 having a dielectric constant of not more than 2.5 (elastic modulus: not more than 5 GPa), film forming methods suitable for the respective materials are used.

Figure 4B:
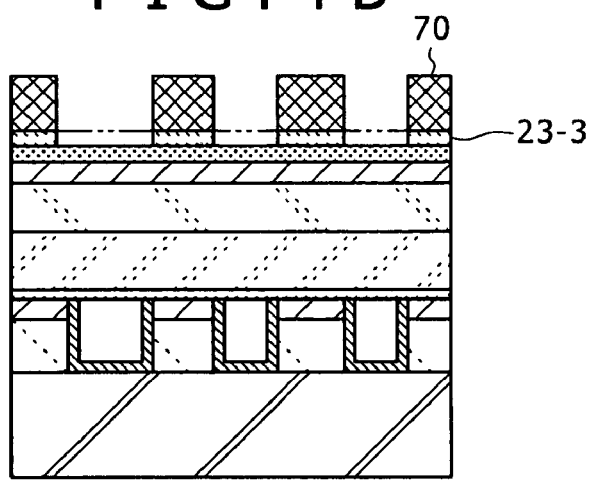

Next, as shown in FIG. 4B, a resist pattern 70 to be a mask for opening a wiring trench pattern is formed on the third hard mask layer 23-3 laminated in the above-mentioned manner.

Subsequently, with the resist pattern 70 as a mask, the third hard mask layer 23-3 is dry etched, to transfer the wiring trench pattern to the third hard mask layer 23-3. After the dry etching is finished, the remaining resist pattern 70 is removed by an ashing treatment or the like.

Figure 4C:
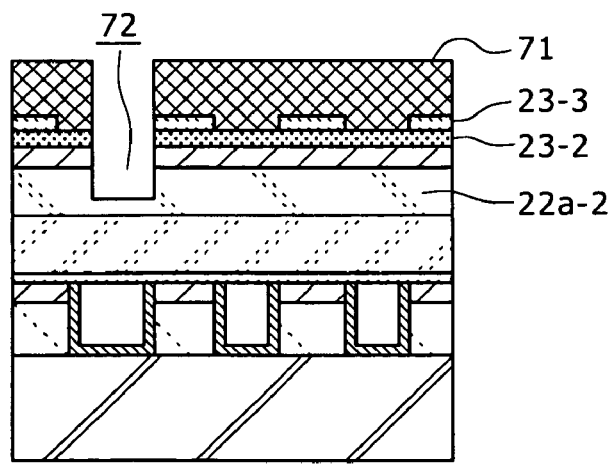

Next, as shown in FIG. 4C, a resist pattern 71 for opening a contact hole is formed on the third hard mask layer 23-3 with the wiring trench pattern transferred thereto and on the second hard mask layer 23-2.

Subsequently, with the resist pattern 71 as a mask, the second hard mask layer 23-2, the first hard mask layer 23-1, and a portion down to an intermediate depth of the organic low-dielectric-constant film 22a-2 are etched, to form an intermediate opening 72 for the contact hole. In this etching, the resist pattern 71 is also etched away simultaneously.

Figure 4D:
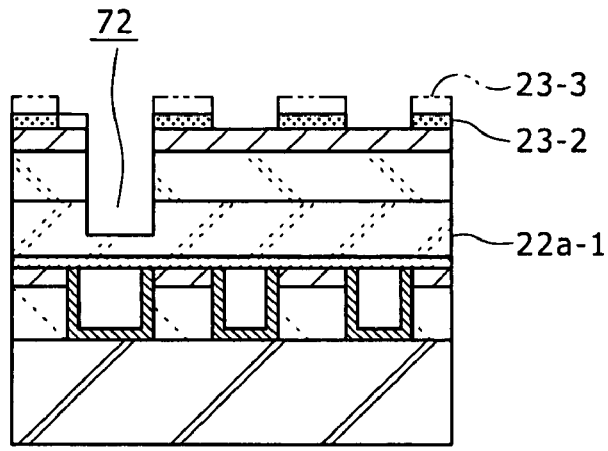

Besides, as shown in FIG. 4D, in the etching for forming the intermediate opening 72 for the contact hole, after the resist pattern 71 is removed by this etching, the etching is further continued, whereby the second hard mask layer 23-2 is etched while using the third hard mask layer 23-3 as a mask. By this, the wiring trench pattern is transferred to the second hard mask layer 23-2, and the intermediate opening 72 is dug down into the inorganic low-dielectric-constant film 22a-1. This etching is conducted until the third hard mask layer 23-3 is removed.

Figure 4E:
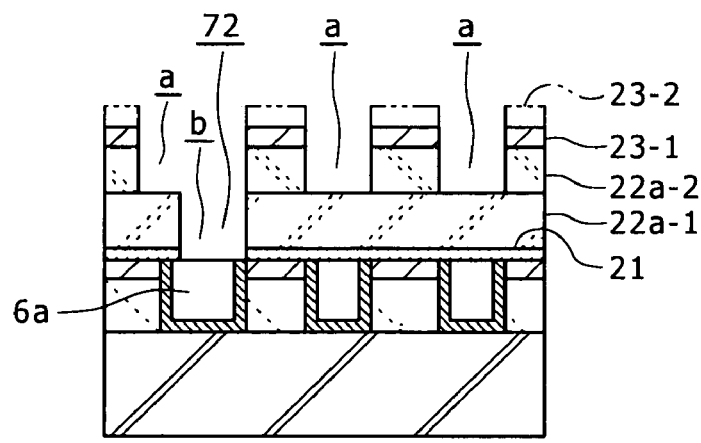

Next, as shown in FIG. 4E, while using the second hard mask layer 23-2 with the wiring trench pattern transferred thereto as a mask, the first hard mask layer 23-1 and the organic low-dielectric-constant film 22a-2 are dry etched, to form wiring trenches "a" in the first hard mask layer 23-1 and the organic low-dielectric-constant film 22a-2.

Thereafter, the dry etching is further continued, to remove the organic low-dielectric-constant film 22a-2 remaining in bottom portions of the wiring trenches "a" as well as the inorganic low-dielectric-constant film 22a-1 and the antioxidation film 21 formed of silicon carbide (SiC) remaining in a bottom portion of the intermediate opening 72 for the contact hole. As a result, a dual Damascene shape is formed, in which the contact hole b in the state of exposing the underlying local wiring 6a is opened in a bottom portion of the wiring trench a. After these steps, etching deposits remaining on the side walls of the wiring trenches "a" and the contact hole b as well as a denatured Cu layer present in a bottom portion of the contact hole b are cleaned up by a post-treatment using an appropriate chemical and a hydrogen annealing treatment.

Incidentally, the method of forming the dual Damascene shape including the wiring trenches "a" and the contact hole b provided in a bottom portion thereof is not limited to the above-described procedure. For example, an another procedure may be adopted, in which first the contact hole b is opened, and thereafter opening of the wiring trenches "a" is conducted by use of a resist mask; naturally, still other procedures may also be used.

Figure 4F:
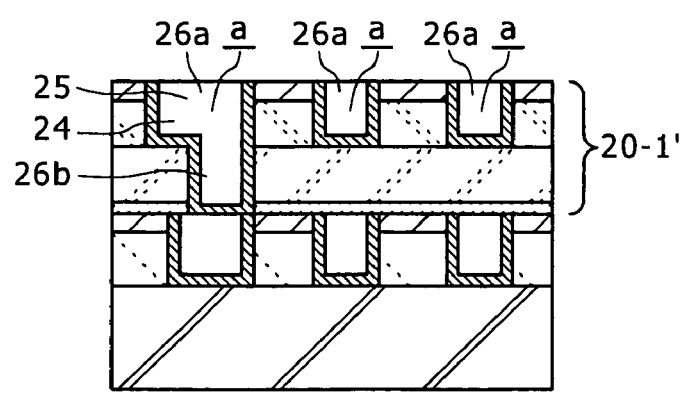

After the above steps, as shown in FIG. 4F, the inside of the wiring trenches "a" and the contact hole b are integrally filled up with a copper (Cu) film 25, with a barrier metal 24 therebetween, to form buried wirings 26a and a via 26b. As a result, a first wiring layer 20-1' is formed, in which the inside of the wiring trenches "a" and the contact hole b formed in a bottom portion thereof is integrally filled up with the copper (Cu) film 25, with the barrier metal 24 therebetween, to form the buried wirings 26a and the via 26b connected thereto. The buried wirings 26a and the via 26b are formed following the procedure of applying the CMP technique, in the same manner as in forming the buried wirings 26a and the via 26b in the first wiring layer 20-1 described referring to FIGS. 2E and 2F in the first embodiment above.

Figure 4G:
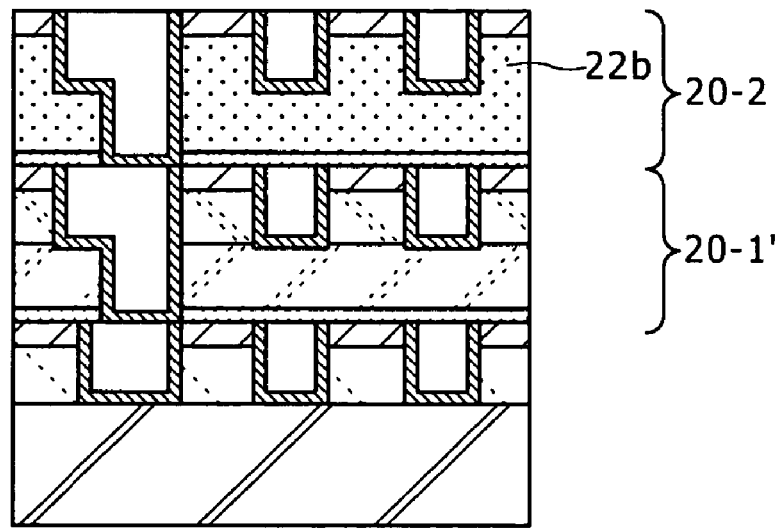

Next, as shown in FIG. 4G, a second wiring layer 20-2 including a reinforcing film 22b composed of a non-porous carbon-containing silicon oxide (SiOC) film (with an elastic modulus of 10 GPa and a dielectric constant of about 2.9) is formed on the first wiring layer 20-1'. Such a second wiring layer 20-2 is formed in the same manner as in forming the second wiring layer 20-2 described referring to FIGS. 2G to 2I in the first embodiment above.

Figure 4H:
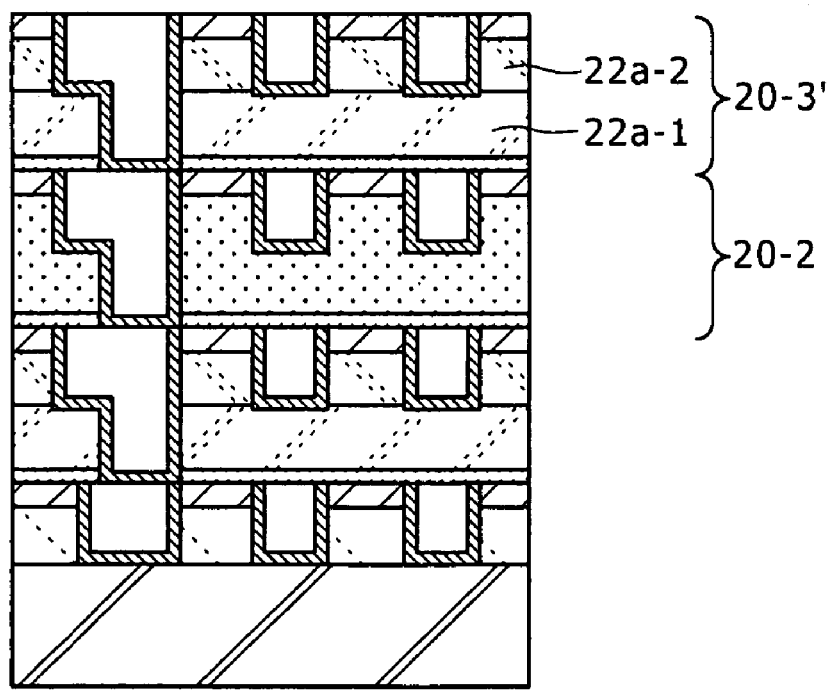

Thereafter, as shown in FIG. 4H, a third wiring layer 20-3' including a laminate structure of an inorganic low-dielectric-constant film 22a-1 and an organic low-dielectric-constant film 22a-2 having very low dielectric constants of not more than 2.5 is formed on the second wiring layer 20-2. Such a third wiring layer 20-3' is formed by repeating the steps described above referring to FIGS. 4A to 4F in this second embodiment.

Further, a fourth wiring layer 20-4 having the same layer configuration as the second wiring layer 20-2 is formed on the third wiring layer 20-3' by repeating the steps described referring to FIGS. 2G to 2I in the first embodiment above. Furthermore, if required, the steps described above referring to FIGS. 4A to 4F and the following steps described above referring to FIGS. 2G to 2I may be repeated. As a result of the above steps, a semiconductor device having a laminated buried wiring structure is completed, in which the wiring layers 20-1' and 20-3' each having the layer configuration including the laminate structure of the inorganic low-dielectric-constant film 22a-1 and the organic low-dielectric-constant film 22a-2 both as low as possible in dielectric constant and the wiring layers 20-2 and 20-4 each having the layer configuration including the reinforcing film 22b having a comparatively higher mechanical strength (preferably, an elastic modulus of not less than 10 GPa) are alternately laminated.

In the second embodiment as above, the first wiring layer 20-1' and the third wiring layer 20-3' each including the laminate structure of the inorganic low-dielectric-constant film 22a-1 and the organic low-dielectric-constant film 22a-2 having very low dielectric constants of not more than 2.5 are alternately laminated with the second wiring layer 20-2 and the fourth wiring layer 20-4 each having the layer configuration including the reinforcing film 22b having a comparatively higher mechanical strength (preferably, an elastic modulus of not less than 10 GPa). Therefore, like in the first embodiment, the layer insulation films low in mechanical strength are dividedly distributed in the lamination direction, and the condition where a layer insulation film portion with a low mechanical strength occupies a monolithic large volume is obviated. This ensures that a semiconductor device with good conduction characteristics and wiring performance can be manufactured in a good yield, without generating film exfoliation in the CMP steps for forming the wiring layers 20-1, 20-2, . . . (particularly, upper layers) and without such troubles as film exfoliation and deformation in other multi-layer forming steps.

Particularly, each of the wiring layers 20-1, 20-2, is a singly collected wiring layer including the buried wirings 26a and the via 26b thereunder, like in the first embodiment. Therefore, when circuit wirings required of higher functions are disposed in the first wiring layer 20-1' and the third wiring layer 20-3', it is possible to contrive enhancement of wiring performance. Here, in the configuration according to the first embodiment as above-described, a reduction in RC delay by not less than about 20% can be achieved, as compared with the case where all wiring layers are formed by use of an inorganic insulation film having a dielectric constant of 2.9 or above.

Particularly, in this second embodiment, the low-dielectric-constant film constituting the most part of each of the first wiring layer 20-1' and the third wiring layer 20-3' is of the hybrid structure of the inorganic low-dielectric-constant film 22a-1 and the organic low-dielectric-constant film 22a-2, whereby opening controllability in forming the wiring trenches "a" is enhanced, and scattering of wiring performance is restrained. Therefore, a further enhancement of the device performance is possible. In addition, in this embodiment, the organic low-dielectric-constant film is adopted also in the local wiring layer 0, for similar reasons.

Third Embodiment

Figure 5:
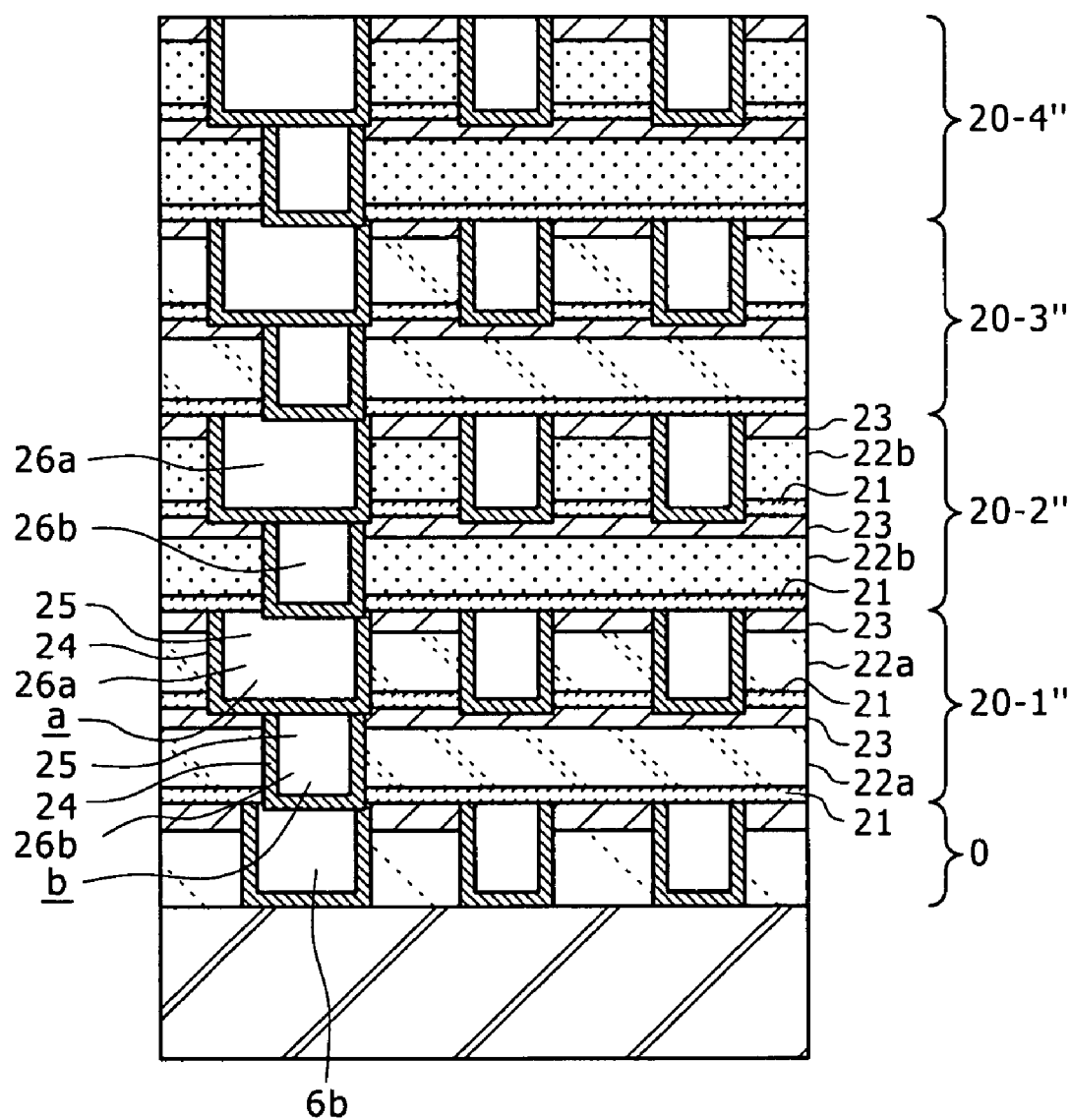
FIG. 5 is a sectional configuration diagram showing a multi-layer wiring structure in a semiconductor device according to a third embodiment of the present invention.

FIG. 5 is a sectional configuration diagram of a semiconductor device according to a third embodiment. The semiconductor device in the third embodiment shown in the figure is different from those in the first and second embodiments in that each wiring layer is configured to have a single Damascene structure; the semiconductor device in the third embodiment is the same as those in the first and second embodiments in that wiring layers 20-1" and 20-2" each having a layer configuration including a low-dielectric-constant film 22a as low as possible in dielectric constant and wiring layers 20-2" and 20-4" each having a layer configuration including a reinforcing film 22b having a comparatively higher mechanical strength (preferably, an elastic modulus of not less than 10 GPa) are alternately laminated.

Specifically, the first wiring layer 20-1" and the third wiring layer 20-3" are formed as follows. First, a layer insulation film obtained by laminating an anti-oxidation film 21 formed of silicon carbide (SiC), a low-dielectric-constant film 22a, and a hard mask layer 23 formed of silicon oxide (SiO$_2$) in this order is doubly laminated, to constitute a layer insulation film. The layer insulation films 21, 22a and 23 on the lower layer side are each provided with a contact hole b reaching to a wiring in the underlying layer. The inside of the contact hole b is filled up with a conductive material film such as a copper (Cu) film 25, with a barrier metal 24 therebetween, to form a via 26b. On the other hand, the layer insulation films 21, 22a and 23 on the upper layer side are each provided with wiring trenches "a", with a bottom portion of which is communicated the contact hole b. The inside of the wiring trenches "a" is filled up with a conductive material film such as a copper (Cu) film 25, with a barrier metal 24 therebetween, to form buried wirings 26a.

Thus, the first wiring layer 20-1" and the third wiring layer 20-3" are each configured to include the layer insulation film obtained by doubly laminating the laminate structure of the anti-oxidation film 21, the low-dielectric-constant film 22a, and the hard mask layer 23; the buried wirings 26a; and the via 26b at a bottom portion of the buried wiring 26a.

The low-dielectric-constant film 22a constituting the most part of the layer insulation film in the first wiring layer 20-1" is preferably composed by use of a material having a dielectric constant as low as possible, for example, a dielectric constant of 2.5 or below, taking into primary account the lowering in the dielectric constant between the buried wiring in the first wiring layer 20-1" and the buried wiring in the overlying or underlying layer and the dielectric constant between the wirings in the first wiring layer 20-1". As a specific example of such a low-dielectric-constant film 22a, the same film as described in the first embodiment is used. Incidentally, the low-dielectric-constant film 22a is lower in dielectric constant but weaker in mechanical strength than the reinforcing film constituting each of the second wiring layer 20-2" and the fourth wiring layer 20-4" to be described next; the mechanical strength of the low-dielectric-constant film 22a is less than 10 GPa. It should be noted here, however, that low-dielectric-constant films 22a composed of upper and lower two layers laminated on each other may not necessarily be formed of the same material. Here, as an example, a porous carbon-containing silicon oxide (SiOC) film having a dielectric constant of 2.2 is used as the low-dielectric-constant film 22a. Incidentally, the low-dielectric-constant film 22a has an elastic modulus of 4 GPa.

In addition, the second wiring layer 20-2" and the fourth wiring layer 20-4" are characterized in that they are each composed by use of the reinforcing film 22b formed of a material higher in mechanical strength than the low-dielectric-constant film 22a constituting the first wiring layer 20-1", and, in the other points, the second and fourth wiring layers are configured in substantially the same manner as the first wiring layer 20-1" and the third wiring layer 20-3".

Specifically, the second wiring layer 20-2" and the fourth wiring layer 20-4" are each configured to include a layer insulation film composed by laminating two laminate structures of an anti-oxidation film 21, a reinforcing film 22b formed of a material higher in mechanical strength than the low-dielectric-constant film 22a, and a hard mask layer 23; buried wirings 26a formed in the upper laminate structure; and a via 26b formed in the lower laminate insulation film.

As described above, the reinforcing film 22b constituting the most part of each of the layer insulation films in the second wiring layer 20-2" and the fourth wiring layer 20-4" is composed by use of a low-dielectric-constant material higher in mechanical strength than the reinforcing film 22b constituting the underlying first wiring layer 20-1, preferably a low-dielectric-constant material having an elastic modulus of not less than 10 GPa. It should be noted here that the reinforcing film 22b having such an elastic modulus has a dielectric constant of 2.9 or above; of materials having such physical property values, one that has a low dielectric constant is preferably used. As a specific example of such a reinforcing film 22b, the same film as described in the first embodiment is used. In addition, the two reinforcing films 22b laminated on each other may not necessarily be formed of the same material. Here, as an example, a non-porous carbon-containing silicon oxide (SiOC) film having an elastic modulus of 10 GPa and a dielectric constant of 2.9 is used as the reinforcing film 22b.

Now, a method of manufacturing the semiconductor in the third embodiment will be described below, based on sectional step diagrams shown in FIGS. 6A to 6K.

Figure 6A:
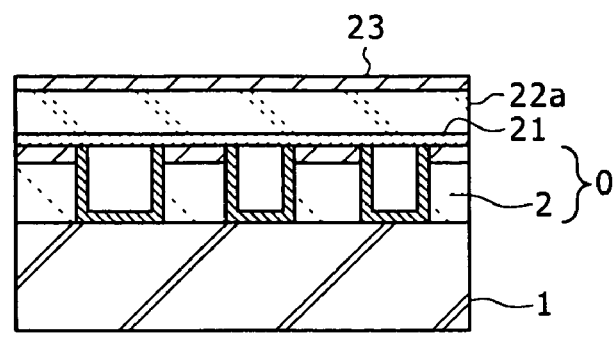
FIGS. 6A to 6K are sectional step diagrams for illustrating the manufacture of the semiconductor device according to the third embodiment.

First, as shown in FIG. 6A, the steps of forming an under layer insulation film 1 formed of silicon oxide on a semiconductor substrate provided with semiconductor devices such as MOS transistor and then forming a local wiring layer 0 on the under layer insulation film 1 are carried out in the same manner as in the first embodiment. Incidentally, a carbon-containing silicon oxide (SiOC) film 2 having an elastic modulus of 10 GPa and a dielectric constant of 2.9 is used here as the layer insulation film on the under layer insulation film 1 for constituting the local wiring layer 0. However, the layer insulation film in the local wiring layer 0 is not limited to this one. In the local wiring layer 0, there are no definite restrictions as to the physical property values of the layer insulation film, since the demand for lowering of dielectric constant on a wiring performance basis is weaker, as compared with the wiring layers 20-1", 20-2", . . . thereabove, and an insulation film high in mechanical strength such as a silicon oxide (SiO$_2$) film is generally adopted as the under layer insulation film 1.

Thereafter, an anti-oxidation film 21 formed of silicon carbide (SiC), a low-dielectric-constant film 22a composed of a porous carbon-containing silicon oxide (SiOC) film, and a hard mask layer 23 formed of silicon oxide (SiO$_2$) are laminated in this order on the local wiring layer 0. Incidentally, the low-dielectric-constant film 22a composed of the porous carbon-containing silicon oxide (SiOC) film is formed in the same manner as described referring to FIG. 2A in the first embodiment above. In addition, the hard mask layer 23 may be omitted, provided that such problems as deshaping, exfoliation of conductive film, and troubles relating to CMP polishing characteristics would not be generated in the subsequent dual Damascene process. Here the embodiment will be described in the case where the hard mask layer 23 is provided.

Figure 6B:
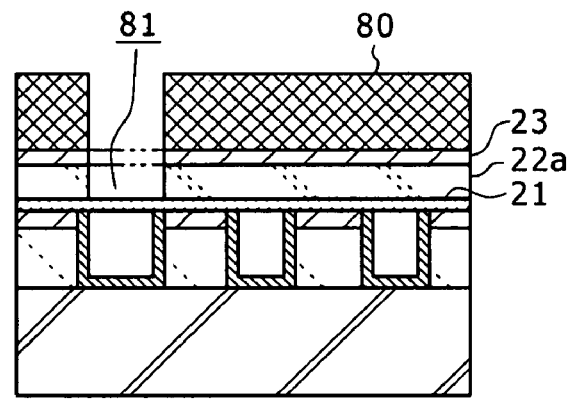

Next, as shown in FIG. 6B, a resist pattern 80 to be a mask for opening a contact hole pattern is formed on the hard mask layer 23 formed to have the laminate structure as above.

Thereafter, with the resist pattern 80 as a mask, the hard mask layer 23 and the low-dielectric-constant film 22a are dry etched, whereby an intermediate opening 81 for a contact hole which reaches a position immediately above the anti-oxidation film 21 is formed. Next, the resist pattern 80 is removed by an ashing treatment.

Figure 6C:
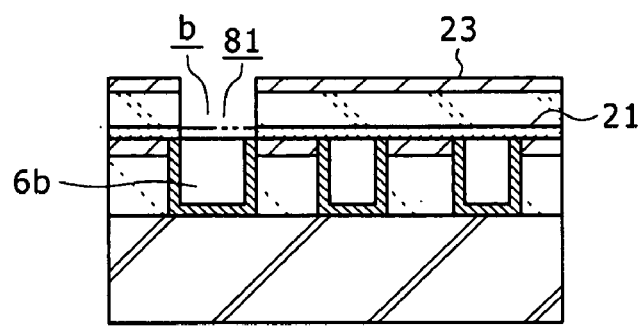

Next, as shown in FIG. 6C, the anti-oxidation film 21 at a bottom portion of the intermediate opening 81 is dry etched from the upper side of the hard mask layer 23, to form the contact hole b reaching the underlying local wiring 6a. Incidentally, the contact hole b may be formed by a method in which the hard mask layer 23 to the anti-oxidation film 21 are removed by one step of etching using the resist pattern 80 shown in FIG. 6B as a mask, to form the contact hole b, and then the resist pattern 80 is removed. In addition, after the contact hole b is formed and the resist pattern 80 is removed, etching deposits remaining on the side wall of the contact hole b and a denatured Cu layer at a bottom portion of the contact hole b are cleaned up by a post-treatment using an appropriate chemical and a hydrogen annealing treatment.

Figure 6D:
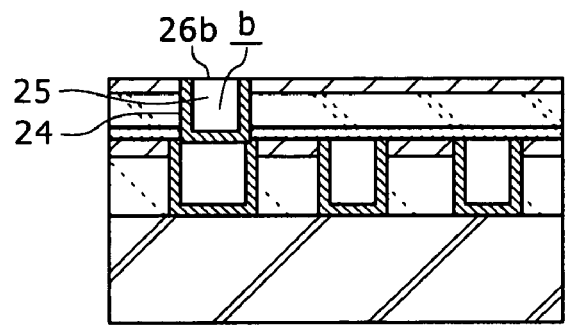

Thereafter, as shown in FIG. 6D, the inside of the contact hole b is filled up with a copper (Cu) film 25, with a barrier metal 24 therebetween, to form the via 26b. The via 26b is formed following the procedure of applying the CMP technique, in the same manner as in forming the buried wirings 26a and the via 26b in the first wiring layer 20-1 described referring to the FIGS. 2E and 2F in the first embodiment above.

Figure 6E:
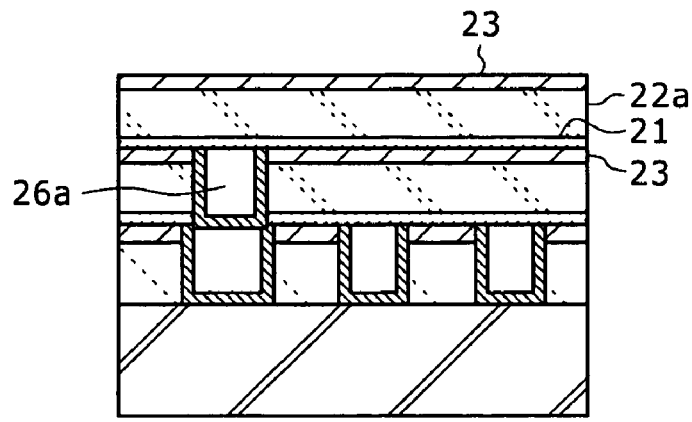

Next, as shown in FIG. 6E, an anti-oxidation film 21, a low-dielectric-constant film 22a composed of a porous carbon-containing silicon oxide (SiOC) film, and a hard mask layer 23 formed of silicon oxide (SiO$_2$) for constituting a second set of films are laminated in this order on the via 26b and the hard mask layer 23.

Figure 6F:
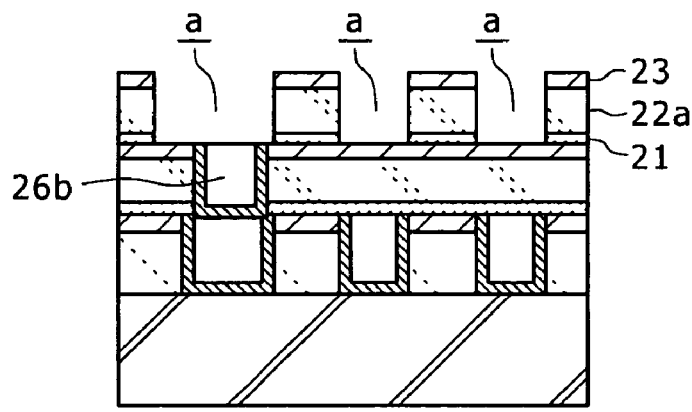

Subsequently, as shown in FIG. 6F, while using a resist pattern (omitted in the figure) formed on the uppermost hard mask layer 23 as a mask, dry etching of the hard mask layer 23, the low-dielectric-constant film 22a and the anti-oxidation film 21 is conducted, to form wiring trenches "a" one of which reaches the via 26b. After the wiring trenches "a" are formed, the resist pattern is removed by an ashing treatment, and a post-treatment is further conducted to clean up the wall portions of the wiring trenches "a". The above steps are carried out in the same manner as in forming the contact hole b described referring to the FIGS. 6B and 6C.

Figure 6G:
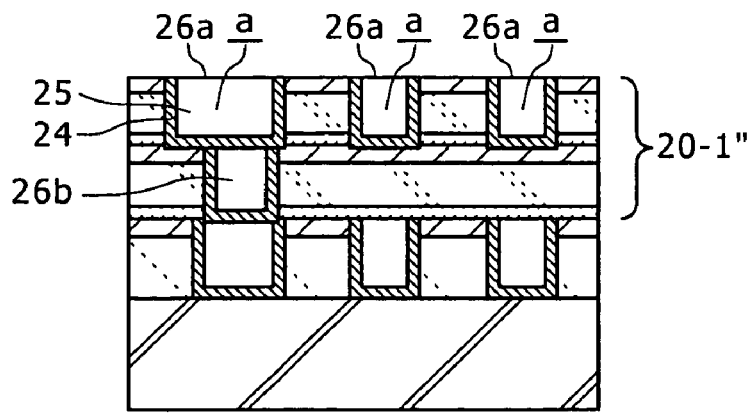

Next, as shown in FIG. 6G, the inside of the wiring trenches "a" is filled up with a copper (Cu) film 25, with a barrier metal 24 therebetween, to form buried wirings 26a. The buried wirings 26a are formed following the procedure of applying the CMP technique, in the same manner as in forming the buried wirings 26a and the via 26b in the first wiring layer 20-1 described referring to FIGS. 2E and 2F in the first embodiment above.

In this manner, the first wiring layer 20-1" is formed, which includes the doubly laminated layer insulation films of the anti-oxidation film 21, the low-dielectric-constant film 22a, and the hard mask layer 23; the buried wirings 26a; and the via 26b at a bottom portion thereof.

Figure 6H:
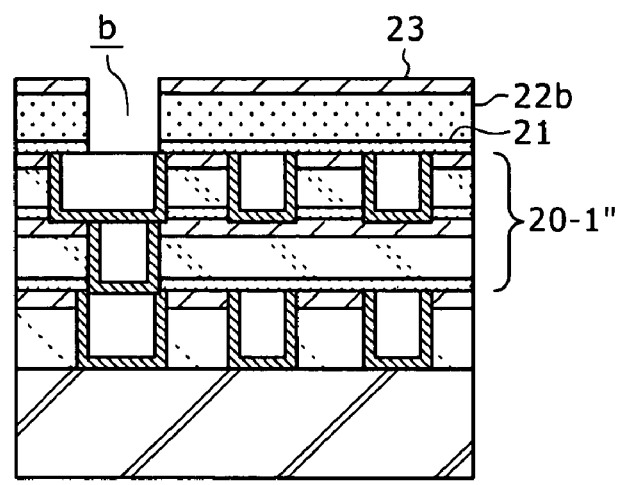

Thereafter, as shown in FIG. 6H, an anti-oxidation film 21 formed of silicon carbide (SiC), a reinforcing film 22b composed of a non-porous carbon-containing silicon oxide (SiOC), and a hard mask layer 23 formed of silicon oxide (SiO$_2$) are laminated in this order on the first wiring layer 20-1". Incidentally, the reinforcing film 22b composed of the non-porous carbon-containing silicon oxide (SiOC) is formed in the same manner as described referring to FIG. 2I in the first embodiment. In addition, the hard mask layer 23 may be omitted, provided that such problems as deshaping, exfoliation of conductive film, and troubles as to CMP polishing characteristics would not be generated in the subsequent dual Damascene process. Here, the embodiment will be described in the case where the hard mask layer 23 is provided.

Then, by etching using a resist pattern (omitted in the figure) as a mask, a contact hole b is opened in the laminate films 23, 22b and 21, the resist pattern is removed, and the wall portion of the contact hole b is cleaned.

Figure 6I:
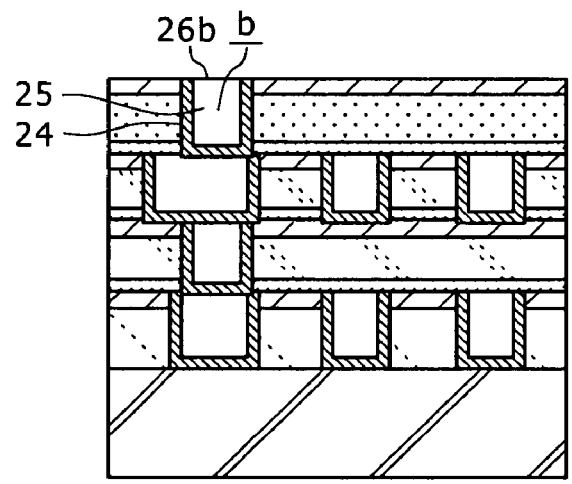

Thereafter, as shown in FIG. 6I, the inside of the contact hole b is filled up with a copper (Cu) film 25, with a barrier metal 24 therebetween, to form a via 26b according to the same procedure of applying the CMP technique as above.

Figure 6J:
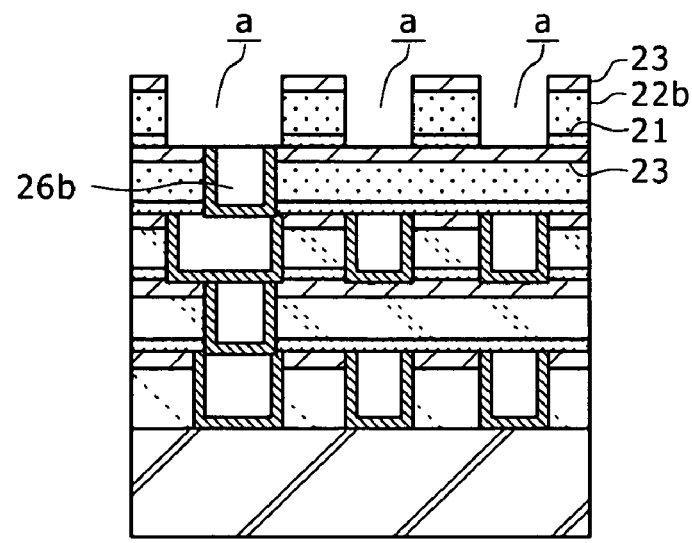

Next, as shown in FIG. 6J, an anti-oxidation film 21 formed of silicon carbide (SiC), a reinforcing film 22b composed of a non-porous carbon-containing silicon oxide (SiOC) film, and a hard mask layer 23 formed of silicon oxide (SiO$_2$) for constituting a second set of films are laminated in this order on the via 26b and the uppermost hard mask layer 23.

Then, by etching using a resist pattern (omitted in the figure) as a mask, wiring trenches "a" are opened in the laminate films 23, 22b and 21, the resist pattern is removed, and wall portions of the wiring trenches "a" are cleaned.

Figure 6K:
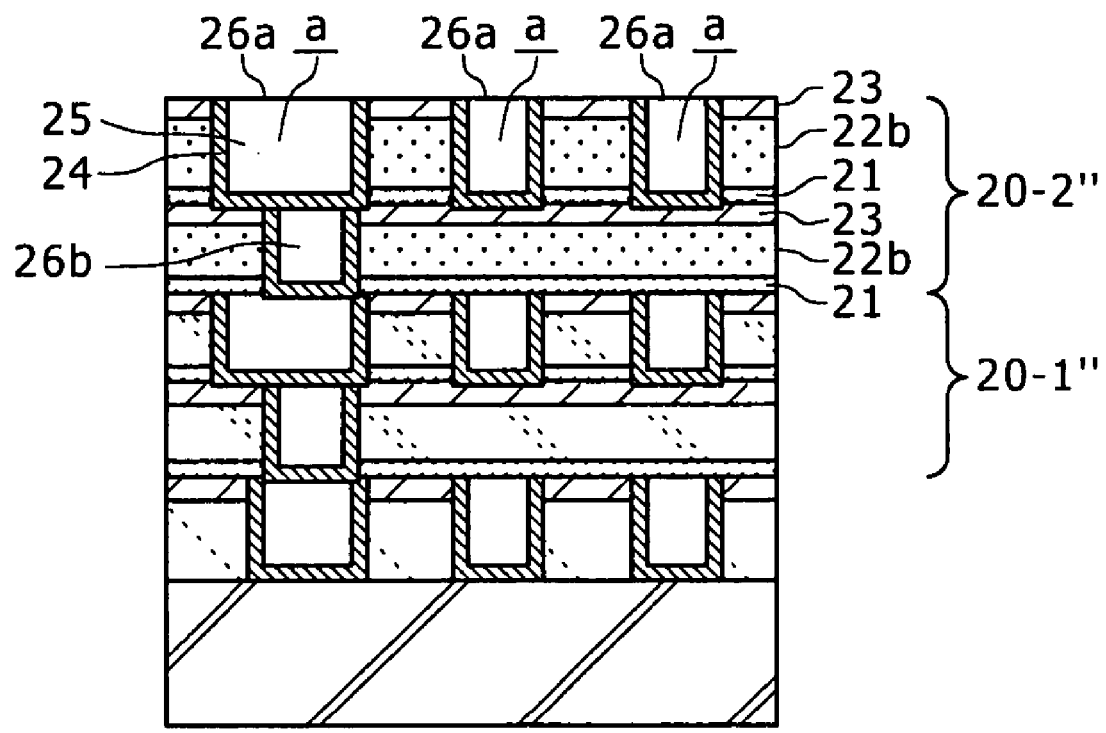
Figure 7:
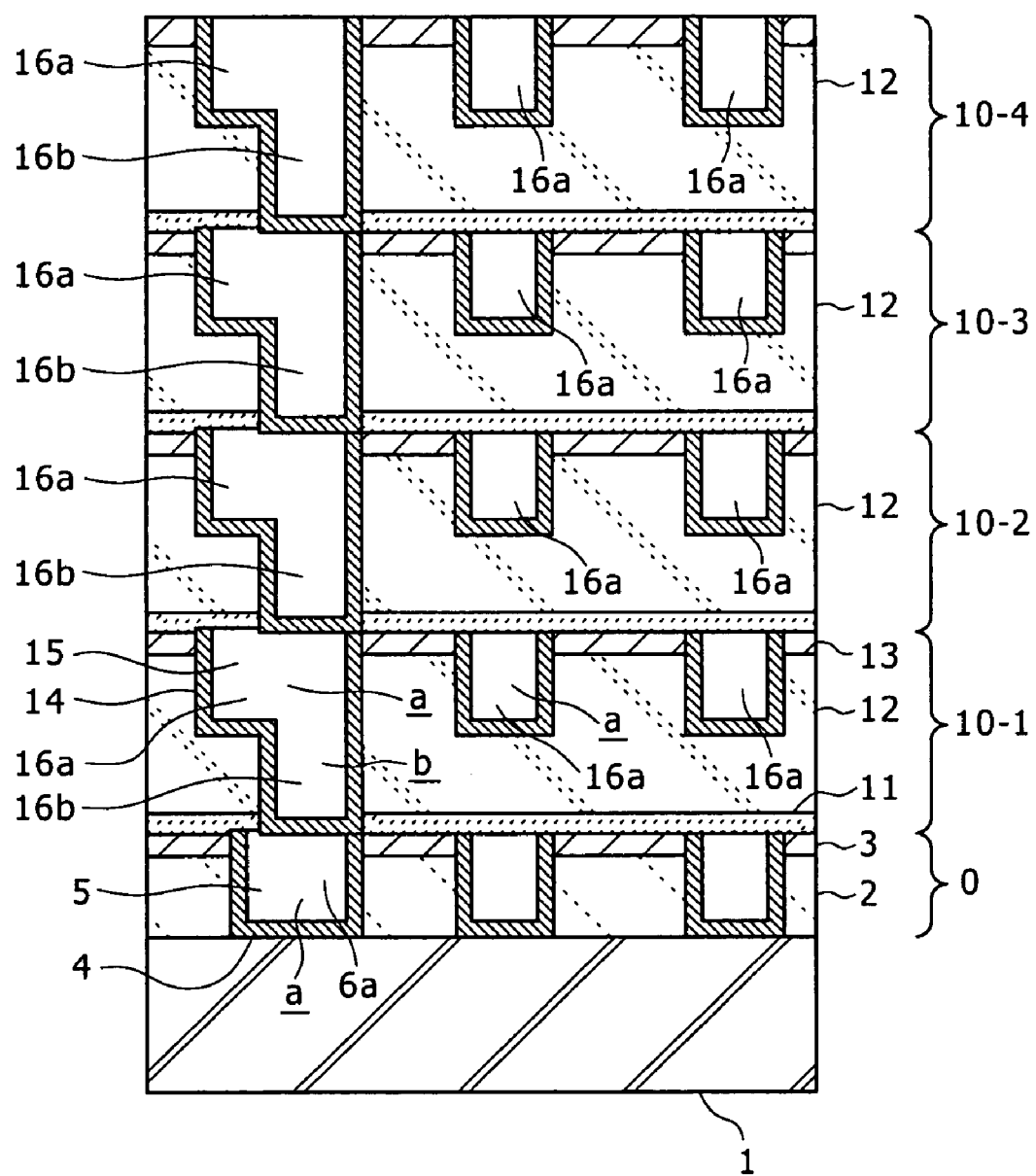
FIG. 7 is a sectional process diagram showing a multi-layer wiring structure in a semiconductor device according to the related art.

Thereafter, as shown in FIG. 6K, the inside of the wiring trenches "a" is filled up with a copper (Cu) film 25, with a barrier metal 24 therebetween, to form buried wirings 26a according to the same procedure of applying the CMP technique as above-described.

In this manner, the second wiring layer 20-2" is formed, which includes the doubly laminated layer insulation films of the anti-oxidation film 21, the reinforcing film 22b higher in mechanical strength than the low-dielectric-constant film 22a used in the first wiring layer 20-1", and the hard mask layer 23; the buried wirings 26a; and the via 26b at a bottom portion thereof.

Thereafter, the steps of forming the first wiring layer 20-1" and the steps of forming the second wiring layer 20-2" are repeated, to form a third wiring layer 20-3" the same in configuration as the first wiring layer 20-1", and to form a fourth wiring layer 20-4" the same in configuration as the second wiring layer 20-2". Further, if required, these steps may be further repeated, to form wiring layers as further upper layers. In this manner, a semiconductor device having a laminate buried wiring structure is formed, in which as shown in FIG. 5, the first wiring layer 20-1" and the third wiring layer 20-3" each having a single Damascene structure including the inorganic low-dielectric-constant film 22a having a dielectric constant as low as possible and the second wiring layer 20-2" and the fourth wiring layer 20-4" each having a single Damascene structure including the reinforcing film 22b having a comparatively higher mechanical strength (preferably, an elastic modulus of not less than 10 GPa) are alternately laminated.

In the third embodiment as above, like in the first embodiment, the first wiring layer 20-1" and the third wiring layer 20-3" each including the low-dielectric-constant film 22a having a very low dielectric constant of 2.5 or below are alternately laminated with the second wiring layer 20-2" and the fourth wiring layer 20-4" including the reinforcing film 22b having a comparatively higher mechanical strength (preferably, an elastic modulus of not less than 10 GPa). Therefore, like in the first embodiment, a semiconductor device having good conduction characteristics and wiring performance can be manufactured in good yield, without generating film exfoliation in the CMP step in forming the wiring layers 20-1", 20-2", . . . (particularly, upper layers), and without such problems as film exfoliation and deformation in other multi-layer forming steps.

In addition, like in the first embodiment, each of the wiring layers 20-1", 20-2", . . . is a singly collected wiring layer including the buried wirings 26a and the via 26b at a bottom portion thereof. Therefore, when circuit wirings required of enhanced functions are disposed in the first wiring layer 20-1" and the third wiring layer 20-3", it is possible to contrive enhancement of wiring performance.

Here, in the configuration of the first embodiment, a reduction in RC delay by about 20% can be achieved, as compared with the case where all wiring layers are formed by use of an inorganic insulation film having a dielectric constant of not less than 2.9.

Particularly, in this third embodiment, a single Damascene structure is adopted, in which the contact hole b and the wiring trenches "a" are opened in separate steps, and are filled with the conductive film. In this structure, the number of steps and the cost are increased, but the opening controllability of the wiring trenches "a" is enhanced and scattering of wiring performance is suppressed, as compared with the first embodiment.

Incidentally, in each of the above embodiments, the first wiring layer including the low-dielectric-constant film with a sufficiently low dielectric constant is disposed directly on the local wiring layer, then the second wiring layer including the reinforcing film with a high mechanical strength is laminated thereon, and these layers are alternately laminated. However, in the present invention, it suffices for these wiring layers to be alternately laminated. Therefore, a configuration may be adopted in which the wiring layer including the reinforcing film with a high mechanical strength is disposed directly on the local wiring layer, and the wiring layer including the low-dielectric-constant film with a sufficiently low dielectric constant is laminated thereon. It should be noted here, however, a wiring layer including a low-dielectric-constant film with a sufficiently low dielectric constant is used as a wiring layer required of high functions. By this, the same effects as those of the above embodiments can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device having a multi-layer wiring structure comprising a plurality of wiring layers, said wiring layers each comprising a buried wiring and a via formed by filling with a conductive material the inside of a wiring trench formed in a layer of insulation film and a contact hole provided at a bottom portion of said wiring trench, wherein
    said layer insulation films of said plurality of wiring layers are so configured that said layer insulation films are changed in a magnitude of mechanical strength alternately in a lamination direction of said wiring layers, wherein
    said multi-layer wiring structure has a configuration in which a first group of said wiring layers are comprised of a low-dielectric-constant film having an elastic modulus of less than 10 GPa and a second group of said wiring layers are comprised of an insulation film having an elastic modulus of not less than 10 GPa as a principal material and one member of each group is alternately laminated.

2. A semiconductor device having a multi-layer wiring structure comprising a plurality of wiring layers, said wiring layers each comprising a buried wiring and a via formed by filling with a conductive material the inside of a wiring trench formed in a layer of insulation film and a contact hole provided at a bottom portion of said wiring trench, wherein
    said layer insulation films of said plurality of wiring layers are so configured that said layer insulation films are changed in a magnitude of mechanical strength alternately in a lamination direction of said wiring layers, wherein
    said multi layer wiring structure has a configuration in which a first group of said wiring layers are comprised of a porous low-dielectric-constant film and a second group of said wiring layers are comprised of a non-porous inorganic insulation film and one member of each group is alternately laminated.

3. A semiconductor device having a multi-layer wiring structure comprising a plurality of wiring layers, said wiring layers each comprising a buried wiring and a via formed by filling with a conductive material the inside of a wiring trench formed in a layer of insulation film and a contact hole provided at a bottom portion of said wiring trench, wherein
    said layer insulation films of said plurality of wiring layers are so configured that said layer insulation films are changed in a magnitude of mechanical strength alternately in a lamination direction of said wiring layers, wherein
    said multi-layer wiring structure has a configuration in which a first group of said wiring layers are comprised of a porous carborn-containing silicon oxide film and a second group of said wiring layers are comprised of a non-porous carbon-containing silicon oxide film and one member of each group is alternately laminated.

4. A semiconductor device having a multi-layer wiring structure comprising a plurality of wiring layers, said wiring layers each comprising a buried wiring and a via formed by filling with a conductive material the inside of a wiring trench formed in a layer of insulation film and a contact hole provided at a bottom portion of said wiring trench, wherein
    said layer insulation films of said plurality of wiring layers are so configured that said layer insulation films are changed in a magnitude of mechanical strength alternately in a lamination direction of said wiring layers wherein
    copper is used as said conductive material constituting said buried wiring and said via which constitute each said wiring layer.

* * * * *